United States Patent
Eichenfield et al.

(10) Patent No.: US 11,948,979 B1
(45) Date of Patent: Apr. 2, 2024

(54) HETEROGENEOUSLY INTEGRATED ACOUSTOELECTRIC AMPLIFIERS

(71) Applicant: National Technology & Engineering Solutions of Sandia, LLC, Albuquerque, NM (US)

(72) Inventors: Matt Eichenfield, Albuquerque, NM (US); Lisa Anne Plucinski Hackett, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 582 days.

(21) Appl. No.: 17/324,399

(22) Filed: May 19, 2021

Related U.S. Application Data

(60) Provisional application No. 63/040,118, filed on Jun. 17, 2020.

(51) Int. Cl.
*H03H 9/02* (2006.01)
*H01L 29/205* (2006.01)
*H01L 41/18* (2006.01)
*H01P 1/383* (2006.01)
*H03F 3/187* (2006.01)
*H10N 30/853* (2023.01)
*H10N 39/00* (2023.01)
*H03H 9/145* (2006.01)

(52) U.S. Cl.
CPC ............ *H01L 29/205* (2013.01); *H01P 1/383* (2013.01); *H03F 3/187* (2013.01); *H03H 9/02574* (2013.01); *H10N 30/8542* (2023.02); *H10N 39/00* (2023.02); *H03F 2200/03* (2013.01); *H03H 9/02976* (2013.01); *H03H 9/14514* (2013.01)

(58) Field of Classification Search
CPC ............ H03H 9/8542; H03H 9/02574; H03H 9/02976; H03H 9/14514
See application file for complete search history.

(56) References Cited

PUBLICATIONS

Adler, R., "Simple Theory of Acoustic Amplification," IEEE Transactions on Sonics and Ultrasonics (1971) 18(3):115-118.
(Continued)

*Primary Examiner* — Derek J Rosenau
(74) *Attorney, Agent, or Firm* — Mark A. Dodd

(57) ABSTRACT

An acoustoelectric amplifier and a number of corresponding devices are disclosed, along with methods for making the same. The acoustoelectric amplifier employs wafer-scale bonding to heterogeneously integrate an epitaxial III-V semiconductor stack and a piezoelectric layer. To increase the acoustic gain with low power dissipation, the electromechanical coupling coefficient ($k^2$) of the piezoelectric layer should be high to increase the acoustoelectric interaction strength. The semiconductor mobility should be high to reduce the voltage required to increase the carrier drift velocity. The conductivity-thickness product should be low to prevent screening of the acoustoelectric interaction. The acoustoelectric amplifier or its corresponding material structure may be used to form circulators, isolators, oscillators, mixers, and correlators, while interconnecting waveguides may be formed of the piezoelectric layer or the semiconductor stack. An exemplary piezoelectric layer is formed of $LiNbO_3$, while an exemplary semiconductor stack is formed of InGaAs/InP.

20 Claims, 15 Drawing Sheets

(56) References Cited

PUBLICATIONS

Coldren, L. A. et al., "The InSb on a Piezoelectric Rayleigh Wave Amplifier," IEEE Transactions on Electron Devices (1974) 21(7):421-427.

Collins, J. H. et al., "Amplification of acoustic Surface Waves with Adjacent Semi-Conductor and Piezoelectric Crystals," Applied Physics Letters (1968) 13(9):314-316.

Hashimoto, K.-Y et al., "Ultra-Wideband Surface Acoustic Wave Devices Using Cu-Grating/Rotated-YX-LiNbO3-Substrate Structure," Japanese Journal of Applied Physics (2004) 43(5B);3063-3066.

Kaczman, D. et al., "A Single-Chip 10-Band WCDMA/HSDPA 4-Band GSM/EDGE SAW-less CMOS Receiver With DigRF 3G Interface and +90 dBm IIP2," IEEE Journal of Solid-State Circuits (2009) 44(3):718-739.

Kompfner, R., "The Traveling-Wave Tube as Amplifier at Microwaves," Proceedings of the I.R.E. (1947) 35(2):124-127.

Rotter, M. et al., "Giant acoustoelectric effect in GaAs/LiNbO3 hybrids," Applied Physics Letters (1998) 73(15):2128-2130.

Yamanouchi, K. et al., "Propagation and Amplification of Rayleigh Waves and Piezoelectric Leaky Surface Waves in LiNbO3," J. Appl. Phys. (1972) 43(3):856-862.

Step 500  Step 510

Step 520  Step 530

Step 540  Step 550

Step 560  Step 570

HETEROGENEOUSLY INTEGRATED ACOUSTOELECTRIC AMPLIFIERS

RELATED APPLICATIONS

This application claims priority to U.S. Provisional Application No. 63/040,118, filed on Jun. 17, 2020, and entitled HETEROGENEOUSLY INTEGRATED ACOUSTOELECTRIC AMPLIFIERS, the entirety of which is incorporated herein by reference.

STATEMENT OF GOVERNMENT INTEREST

This invention was made with Government support under Contract No. DE-NA0003525 awarded by the United States Department of Energy/National Nuclear Security Administration. The Government has certain rights in the invention.

TECHNICAL FIELD

The present invention relates to a heterogeneously integrated acoustoelectric amplifiers employing either boundary or multi-layer guiding, devices incorporating acoustoelectric amplifiers, and methods of fabricating the same.

BACKGROUND

Radio frequency (RF) devices are becoming more multi-band, increasing the number of filters and other front-end components while simultaneously pushing towards reduced cost, size, weight, and power (CSWaP). One approach to reducing CSWaP is to eliminate high quality factor filtering that relies on acoustic wave technologies, allowing end-to-end solutions in CMOS or compound semiconductor platforms. See, D. Kaczman et al., "A Single-Chip 10-Band WCDMA/HSDPA 4-Band GSM/EDGE SAW-less CMOS Receiver with DigRF 3G Interface and +90 dBm IIP2," IEEE Journal of Solid-State Circuits, vol. 44, no. 3, pp. 718-739 (2009), the contents of which are incorporated herein by reference. Another way would be to augment the achievable functionalities of electromechanical/acoustic filtering chips to include "active" and nonlinear functionalities, such as gain and mixing. The acoustoelectric (AE) effect could enable such active acoustic wave devices, but, to compete with the performance of today's multi-chip architectures, any solution to this problem needs to provide high gain, large bandwidth, a low noise figure, and sufficient power handling, in addition to the reduced CSWaP.

SAW amplifiers based on the AE effect were demonstrated as early as the 1960s. See, J. H. Collins et al., "Amplification of Acoustic Surface Waves with Adjacent Semiconductor and Piezoelectric Crystals," Applied Physics Letters, vol. 13, no. 9, pp. 314-316 (1968), the contents of which are incorporated herein by reference. In these devices, evanescent fields associated with piezoelectric acoustic waves interact with charge carriers undergoing voltage-induced drift. The interaction causes polarization of the drifting majority charge carriers that leads to a Coulomb drag effect, resulting in acoustic wave attenuation or amplification, analogous to a traveling-wave tube amplifier. See, M. Rotter et al., "Giant acoustoelectric effect in GaAs/LiNbO$_3$ hybrids," Applied Physics Letters, vol. 73, no. 15, pp. 2128-2130 (1998); and R. Kompfner, "The Traveling-Wave Tube as Amplifier at Microwaves," Proceedings of the Institute of Radio Engineers, vol. 35, no. 2, pp. 124-127 (1947), the contents of each of which are incorporated herein by reference. The expected loss per radian $\alpha/k_0$ can be described by an intuitive model that treats the system as an RC circuit:

$$\frac{\alpha}{k_0} = \frac{1}{2} k_{AE}^2 \frac{\gamma \omega \tau}{1 + (\gamma \omega \tau)^2} \quad \text{(Eq. 1)}$$

where $k_{AE}^2$ is an effective electromechanical coupling coefficient between the drifting carriers and the piezoelectric wave, $k_0$ is the acoustic wave number, $\gamma=(1-v_d/v_s)$, $v_d=\mu E$ is the carrier drift velocity, $\mu$ is the carrier mobility, E is the electric field, and $v_s$ is the SAW velocity. The value of $k_{AE}^2$ is equivalent to the SAW substrate electromechanical coupling coefficient $k^2=2\Delta v/v_f$, where $\Delta v=v_f-v_m$ is the difference between the acoustic velocities $v_f$ and $v_m$ for the open (free) and short (metallized) boundary conditions, respectively. For an acoustically thin film, $\tau=(\epsilon+\epsilon_0)\sigma k_0 t$ where $\epsilon$ is the piezoelectric material permittivity, $\epsilon_0$ is the vacuum permittivity, $\sigma$ is the semiconductor conductivity, and t is the semiconductor thickness. See, R. Adler, "Simple Theory of Acoustic Amplification," IEEE Transactions on Sonics and Ultrasonics, vol. Su18, no. 3, pp. 115 (1971), the contents of which are incorporated herein by reference.

The amplifier performance is improved by utilizing a piezoelectric substrate with a large $k_{AE}^2$, which alone determines the maximum $\alpha/k_0$, combined with a semiconductor with small $\sigma t$ and high $\mu$ to lower the required voltage for a given gain. See, Adler. Previous demonstrations of SAW amplifiers have resulted in over 100 dB of RF output contrast, i.e., electronic gain, but required voltages of greater than 1 kV. See, L. A. Coldren and G. S. Kino, "The InSb on a Piezoelectric Rayleigh-Wave Amplifier," IEEE Transactions on Electron Devices, vol. 21, no. 7, pp. 421-427 (1974), the contents of which are incorporated herein by reference.

In spite of these previous efforts, the need still exists for a high gain acoustoelectric amplifier that enables compact, high-gain devices with significantly lower power consumption.

SUMMARY

One aspect of the present invention relates to an acoustoelectric amplifier based on wafer-scale bonding to achieve heterogeneous integration of an epitaxial III-V semiconductor layer and a piezoelectric layer, providing a solution to the aforementioned problems and enabling compact, high-gain devices with significantly lower power consumption. Rotated Y-cuts of LiNbO$_3$ as the piezoelectric layer support surface acoustic waves of shear horizontal polarization with exceptionally high $k^2$. However, these acoustic waves also suffer propagation losses due to bulk mode coupling. YX LiNbO$_3$ has a $k^2$ of almost 25%, but also has significant propagation losses. 41° YX LiNbO$_3$ has a $k^2$ of 17.2%, no loss for the open boundary condition, and a propagation loss of only 0.04 dB/A for the shorted boundary condition. In addition, 64° YX LiNbO$_3$ has a $k^2$ of 11.3%, no loss for the shorted boundary condition, and a propagation loss of only 0.04 dB/A for the open boundary condition. In the case of a guided wave in a piezoelectric layer with a thickness less than the acoustic wavelength, this source of propagation loss is eliminated while the large $k^2$ for the modes with shear horizontal polarization is maintained. An acoustoelectric amplifier in accordance with one or more embodiments demonstrated an acoustic gain of 1.3 dB/Λ in a 505 μm long device, where Λ is the acoustic wavelength, an electronic gain of 800 dB/cm, and a terminal gain of 13.5 dB. Moreover, due to the directly bonded semiconductor layer's low σt and relatively high μ, this large peak gain occurs at only −60 V.

In various embodiments of the present invention, the acoustoelectric amplifier may be used by itself, as part of a larger element, for example a circulator, or as part of an overall function with various elements interconnected, for example, with waveguides formed of $LiNbO_3$ or the semiconductor layer.

In at least one embodiment of the present invention, a device comprises an acoustoelectric amplifier, the acoustoelectric amplifier including a piezoelectric layer, a substantially crystalline semiconductor amplifier layer (the semiconductor amplifier layer being acoustically thin and on the piezoelectric layer), first and second transducers (the first and second transducers on the piezoelectric layer), and first and second direct current (DC) contacts (the first and second DC contacts at least partially on the semiconductor amplifier layer).

In various embodiments, the piezoelectric layer includes one of $LiNbO_3$ or a hybrid substrate (the hybrid substrate including a Si substrate and a layer of $LiNbO_3$ (the layer of $LiNbO_3$ on the Si substrate, a thickness of the layer of $LiNbO_3$ being substantially less than one acoustic wavelength (Λ) at an operating frequency in the layer of $LiNbO_3$)); a thickness of the semiconductor amplifier layer is substantially less than one acoustic wavelength (Λ) at an operating frequency in the semiconductor amplifier layer; the thickness of the semiconductor amplifier layer is one of less than 0.5 Λ, less than 0.2 Λ, or less than 0.1 Λ; the device further includes an insulating surface passivation layer (the insulating surface passivation layer between the substantially crystalline semiconductor amplifier layer and the piezoelectric layer); and the substantially crystalline semiconductor amplifier layer includes $In_{0.53}Ga_{0.47}As$.

In other embodiments, the substantially crystalline semiconductor amplifier layer includes an epitaxial stack (the epitaxial stack including an InGaAs amplifier layer and an InP cap layer, the InP cap layer between the InGaAs amplifier layer and the piezoelectric layer); the InGaAs amplifier layer has a composition of approximately $In_{0.53}Ga_{0.47}As$, a doping level of the InGaAs amplifier layer being less than or equal to substantially $1\times10^{16}$ $cm^{-3}$, a thickness of the InGaAs amplifier layer being less than or equal to substantially 100 nm, the InP cap layer being not intentionally doped, and a thickness of the InP cap layer being approximately 5 nm; the epitaxial stack further includes an InP etch stop layer and an InGaAs contact layer (the InP etch stop layer and the InGaAs contact layer between the InGaAs amplifier layer and the first and second DC contacts); a doping level of the InP etch stop layer being approximately $1\times10^{18}$ $cm^{-3}$, a thickness of the InP etch stop layer being approximately 100 nm, the InGaAs contact layer has a composition of approximately $In_{0.53}Ga_{0.47}As$, a doping level of the InGaAs contact layer being approximately $2\times10^{19}$ $cm^{-3}$, and a thickness of the InGaAs contact layer is approximately 100 nm; the epitaxial stack further includes an InAlAs layer (the InAlAs layer between the InGaAs amplifier layer and the first and second DC contacts); and the InAlAs layer has a composition of approximately $In_{0.52}Al_{0.48}As$, a doping level of the InAlAs layer being between approximately $1\times10^{17}$ $cm^{-3}$ and $1\times10^{18}$ $cm^{-3}$, and a thickness of the InAlAs layer being approximately 50 nm or less.

In yet other embodiments, the first and second transducers are integrated interdigital transducers (IDTs) and the first and second transducers each includes an aperture equal to or greater than substantially 15 acoustic wavelengths (Λ) at an operating frequency in the semiconductor amplifier layer; the first and second transducers are single-phase unidirectional transducers (SPUDTs) and the first and second transducers each includes a first plurality of fingers (having a width of approximately one-eighth of an acoustic wavelength at an operating frequency in the semiconductor amplifier layer) and a second plurality of fingers (having a width of approximately three-eighths of the acoustic wavelength); and a number of electrodes in each of the first and second transducers is adapted to impedance match the first and second transducers to substantially 50 ohms.

In certain embodiments, the acoustoelectric amplifier includes an acoustic waveguide; the semiconductor amplifier layer forms a portion of the acoustic waveguide; the acoustic waveguide includes at least one of an acoustic horn, a phononic crystal, or a suspended bridge; the first and second transducers are focusing transducers; and the device includes at least one of a three-port circulator, a two-port circulator, a ring isolator, a power amplifier, an oscillator, a mixer, or a correlator.

Features from any of the disclosed embodiments may be used in combination with one another, without limitation. In addition, other features and advantages of the present disclosure will become apparent to those of ordinary skill in the art through consideration of the following detailed description and the accompanying drawings.

BRIEF DESCRIPTION OF THE DRAWINGS

The drawings illustrate several embodiments of the invention, wherein identical reference numerals refer to identical or similar elements or features in different views or embodiments shown in the drawings. The drawings are not to scale and are intended only to illustrate the elements of various embodiments of the present invention.

DETAILED DESCRIPTION

The Acoustoelectric Amplifier Device

FIGS. 1A-1D illustrate an acoustoelectric amplifier 100 in accordance with one or more embodiments of the present invention at various scales. Some of the guiding principles that led to the illustrated structure are: (1) To increase the acoustic gain with low power dissipation, the piezoelectric layer electromechanical coupling coefficient ($k^2$) should be high to increase the acoustoelectric interaction strength. 41° YX LiNbO$_3$ was selected as it has a $k^2$ exceeding 17%. (2) The semiconductor mobility should be high to reduce the voltage required to increase the carrier drift velocity. In$_{0.53}$Ga$_{0.47}$As was selected as it has a bulk mobility exceeding 10,000 cm$^2$/Vs. (3) The conductivity-thickness product should be low by reducing the carrier density and semiconductor thickness to prevent screening of the acoustoelectric interaction. In$_{0.53}$Ga$_{0.47}$As was again selected as its doping and thickness can be controlled.

Figure 1A:
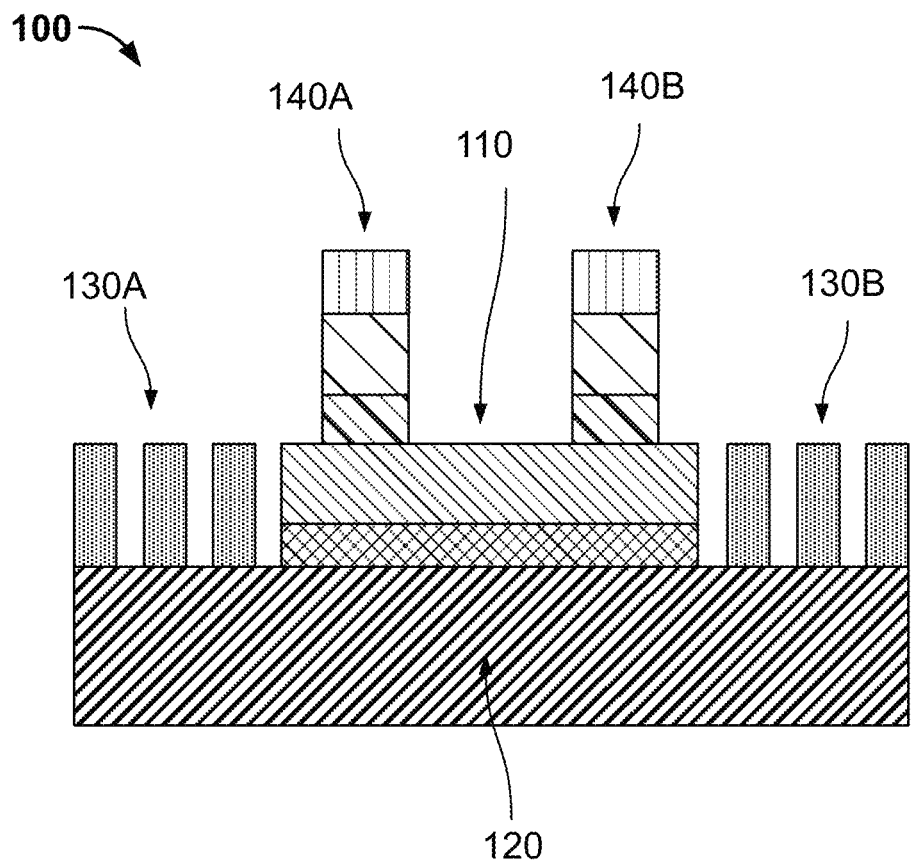
FIGS. 1A-1E illustrate acoustoelectric amplifiers in accordance with one or more embodiments.
Figure 1B:
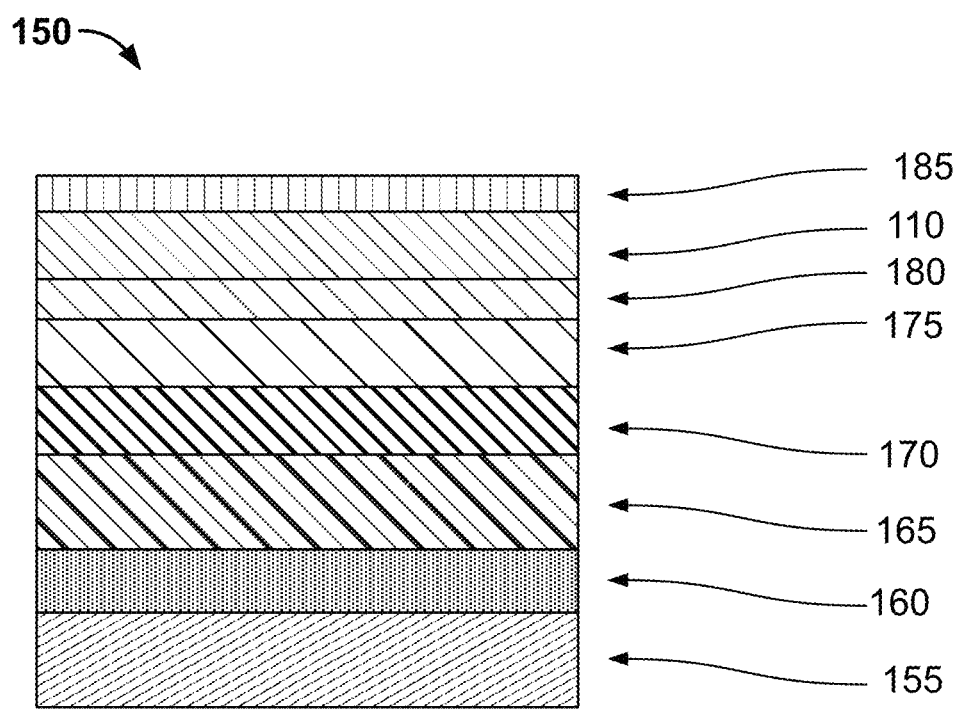

As shown in a cross-sectional view in FIG. 1A, the acoustoelectric amplifier 100 consists of an acoustically thin In$_{0.53}$Ga$_{0.47}$As amplifier layer 110 on a 41° YX LiNbO$_3$ piezoelectric layer 120 with integrated interdigital transducers (IDTs) 130A, 130B, and direct current (DC) contacts 140A, 140B. The In$_{0.53}$Ga$_{0.47}$As amplifier layer 110 is acoustically thin in that its thickness is substantially less than one acoustic wavelength Λ (the acoustic wavelength in the In$_{0.53}$Ga$_{0.47}$As amplifier layer 110), for example, less than 0.5 Λ, less than 0.2 Λ, or less than 0.1 Λ. The lattice-matched In$_{0.53}$Ga$_{0.47}$As(P)/InP epitaxial stack 150 that yields the In$_{0.53}$Ga$_{0.47}$As amplifier layer 110 is illustrated in FIG. 1B. Due to the technique used to form the lattice-matched In$_{0.53}$Ga$_{0.47}$As(P)/InP epitaxial stack 150, it is substantially crystalline. Atomic force microscope scans demonstrated the surface of the lattice-matched In$_{0.53}$Ga$_{0.47}$As(P)/InP epitaxial stack 150 had a low defectivity and rms roughness. This enabled the acoustoelectric amplifier 100, such as the one shown in the scanning electron microscope images in FIGS. 1C and 1D to be fabricated over a 2-inch InP wafer with greater than 75% yield. The yield typically depends on the number of particles and defects on the epitaxial stack 150 or piezoelectric layer 120 that locally prohibits bonding.

The substantially crystalline lattice-matched In$_{0.53}$Ga$_{0.47}$As(P)/InP epitaxial stack 150 includes an InP substrate 155, an InP buffer layer 160, an In$_{0.53}$Ga$_{0.47}$As etch stop layer 165, an InP etch stop layer 170, an In$_{0.53}$Ga$_{0.47}$As contact layer 175, an InP etch stop layer 180, the In$_{0.53}$Ga$_{0.47}$As amplifier layer 110, and an InP cap layer 185. The InP substrate 155 is preferably semi-insulating and 2 inches in diameter. The InP buffer layer 160 is preferably non-intentionally doped (NID) and has a thickness of approximately 500 nm. The In$_{0.53}$Ga$_{0.47}$As etch stop layer 165 is preferably NID and has a thickness of approximately 1500 nm. The InP etch stop layer 170 is preferably doped n-type at approximately $1\times10^{18}$ cm$^{-3}$ and has a thickness of approximately 100 nm. The In$_{0.53}$Ga$_{0.47}$As contact layer 175 is preferably doped n-type at approximately $2\times10^{19}$ cm$^{-3}$ and has a thickness of approximately 100 nm. The InP etch stop layer 180 is preferably doped n-type at approximately $1\times10^{18}$ cm$^{-3}$ and has a thickness of approximately 300 nm. The In$_{0.53}$Ga$_{0.47}$As amplifier layer 110 is preferably doped n-type at approximately $5\times10^{15}$ cm$^{-3}$ and has a thickness of approximately 100 nm. The InP cap layer 185 is preferably NID (thus highly insulating) and has a thickness of approximately 5 nm. The lattice-matched In$_{0.53}$Ga$_{0.47}$As(P)/InP epitaxial stack 150 is preferably grown by MOCVD or MBE to ensure that it is substantially crystalline.

As will be appreciated by those of ordinary skill in the art, the specific composition of In$_{0.53}$Ga$_{0.47}$As is preferred as it is lattice matched to the InP substrate 155. This results in highly crystalline layers that are not excessively strained and contain relatively few strain-relieving defects. The highly crystalline and low strain/low defect nature of an In$_{0.53}$Ga$_{0.47}$As layer yields the desired high carrier mobility for the In$_{0.53}$Ga$_{0.47}$As amplifier layer 110.

The InP substrate 155 diameter can vary, but preferably is the same or less than the diameter of the piezoelectric layer 120. The InP buffer layer 160, the In$_{0.53}$Ga$_{0.47}$As etch stop layer 165, and the InP etch stop layer 170 can have substantial variations in terms of thicknesses and doping levels. Each layer thickness and doping level for the InP buffer layer 160, In$_{0.53}$Ga$_{0.47}$As etch stop layer 165, and InP etch stop layer 170 should ideally enable a controllable etch such that the subsequent layer thickness is accurately preserved.

The In$_{0.53}$Ga$_{0.47}$As contact layer 175 and the InP etch stop layer 180 are optional, but serve to provide quasi-Ohmic direct current (DC) contacts 140A, 140B to the high resistivity In$_{0.53}$Ga$_{0.47}$As amplifier layer 110 for improved device performance. The thickness of the In$_{0.53}$Ga$_{0.47}$As contact layer 175 and the InP etch stop layer 180 are each as thin as possible while still providing the quasi-Ohmic electrical connection and preserving the thickness and doping level of the subsequent In$_{0.53}$Ga$_{0.47}$As amplifier layer 110. The doping level of the In$_{0.53}$Ga$_{0.47}$As contact layer 175 and the InP etch stop layer 180 is preferably significantly higher than the doping level for the In$_{0.53}$Ga$_{0.47}$As amplifier layer 110. The conductivity-thickness product of the In$_{0.53}$Ga$_{0.47}$As amplifier layer 110 is preferably much less than 100 μS in order to increase the gain slope (amount of gain per applied volt) and reduce the dissipated DC power to achieve a given gain value. While the conductivity-thickness product must also be large enough to support the acoustoelectric interaction, it is challenging to achieve doping levels less than $5\times10^{15}$ cm$^{-3}$ for the In$_{0.53}$Ga$_{0.47}$As amplifier layer 110. Therefore, in a preferred embodiment, the doping level of the In$_{0.53}$Ga$_{0.47}$As amplifier layer 110 is less than or equal to approximately $1\times10^{16}$ cm$^{-3}$ and the thickness is less than or equal to approximately 100 nm.

The InP cap layer 185 is preferably NID or has a very low doping concentration such that it is highly insulating to prevent screening of the acoustoelectric interaction. The thickness of the InP cap layer 185 must be as thick as necessary to provide a stable bond between the epitaxial stack 150 and the piezoelectric layer 120. However, it is preferable for the InP cap layer 185 to be as thin as possible as a thicker layer will reduce the acoustoelectric interaction strength. Ideally the total thickness of the epitaxial layers on top of the piezoelectric layer 120 after complete device fabrication is substantially less than an acoustic wavelength to prevent acoustic radiation into a thick epitaxial stack.

The $In_{0.53}Ga_{0.47}As$ amplifier layer 110 preferably has a width that is equal to or larger than the IDT aperture if no acoustic focusing methods are utilized. The length of the $In_{0.53}Ga_{0.47}As$ amplifier layer 110 depends upon the required gain, device dimensions, and DC power dissipation. A longer $In_{0.53}Ga_{0.47}As$ amplifier layer 110 will provide greater terminal gain, but will take up more space on the chip and have a larger DC power dissipation. The IDTs 130A, 130B are preferably formed of an approximately 300 nm thick aluminum layer on an approximately 10 nm thick chrome adhesion layer. The aperture of the IDTs 130A, 130B is preferably large enough to minimize or prevent diffraction losses, for example, equal to or greater than substantially 15Λ, with Λ being the acoustic wavelength in the $In_{0.53}Ga_{0.47}As$ amplifier layer 110. The number of electrodes in the IDTs 130A, 130B is preferably optimized to impedance match to substantially 50 ohms. The design of the IDTs 130A, 130B can be a traditional design with a pitch of Λ/2 or a modified design to improve performance, such as a single-phase unidirectional transducer (SPUDT), as will be described below with reference to FIG. 16. For an IDT aperture of 240 μm on a 41° YX $LiNbO_3$ substrate, a traditional IDT would preferably have 28 electrodes for impedance matching and a SPUDT would preferably have 21 cells for impedance matching. The DC contacts 140A, 140B need to make Ohmic contact and are preferably a titanium, gold, silver, gold metal stack with approximate thicknesses of 20 nm, 100 nm, 1000 nm, and 200 nm, respectively. The width of the DC contacts 140A, 140B is preferably 25 μm or a value that gives good mechanical stability and adhesion to the epitaxial semiconductor.

Figure 1C:
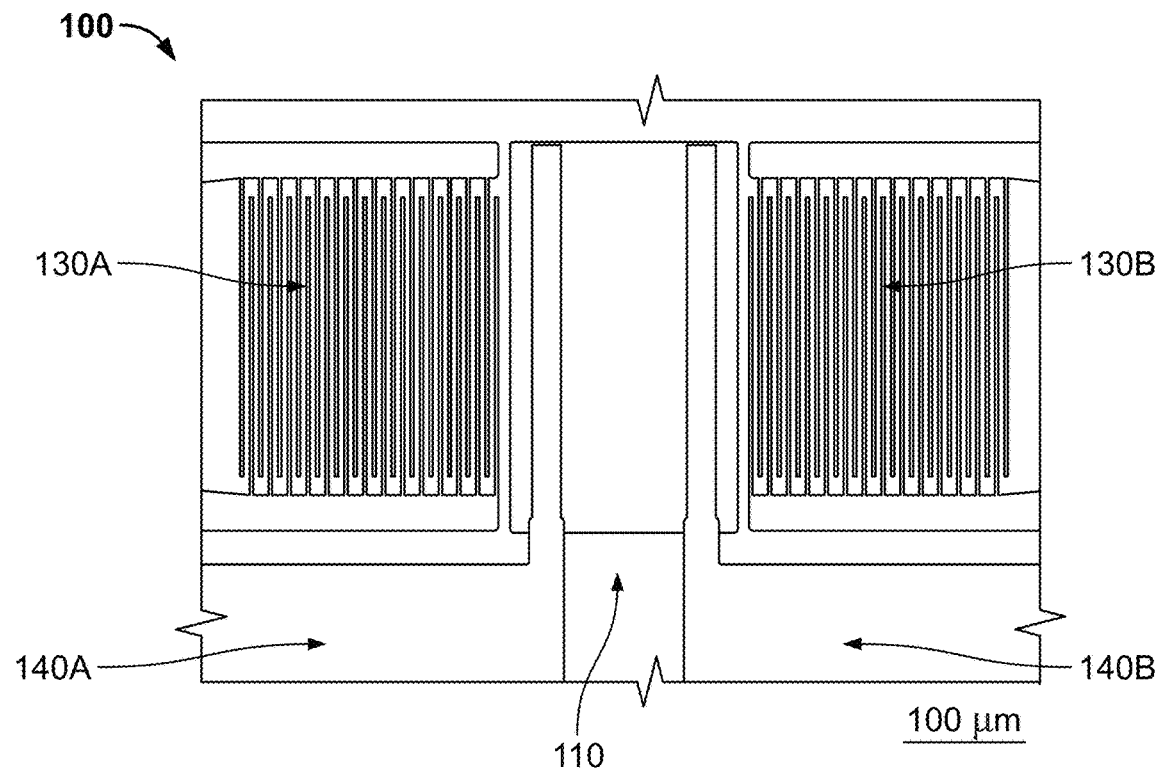
Figure 1D:
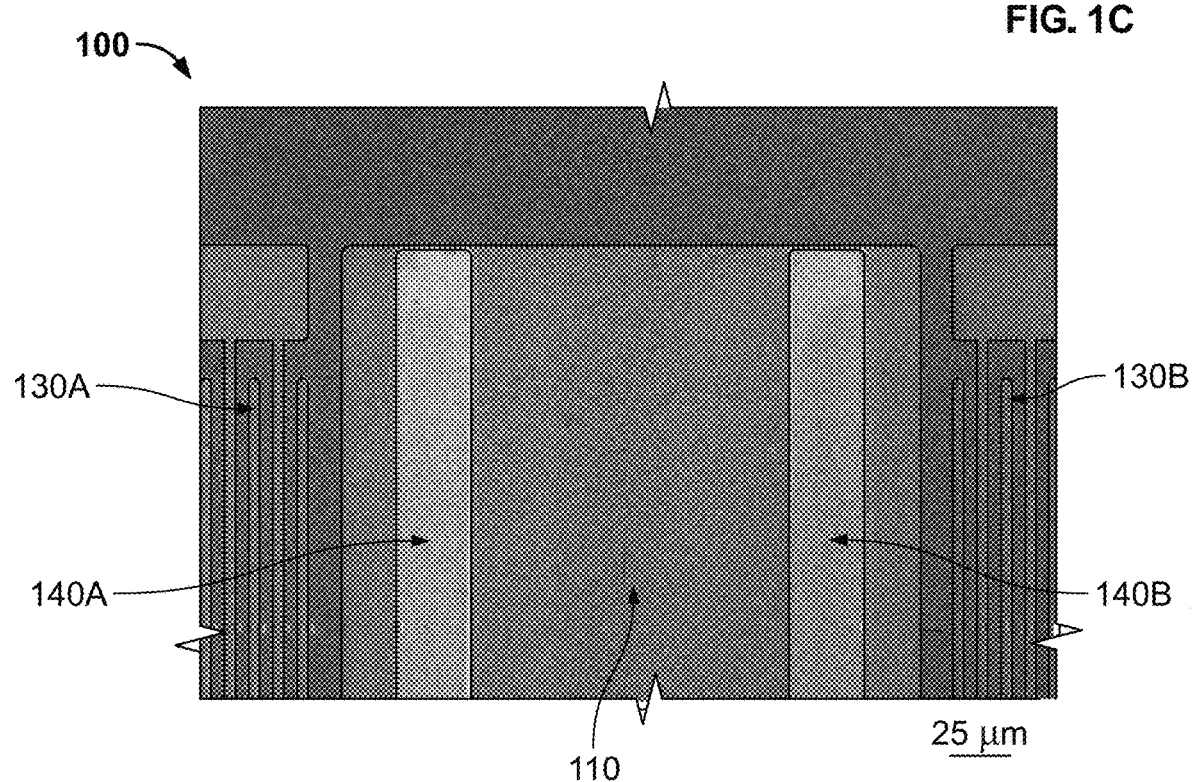
Figure 1E:
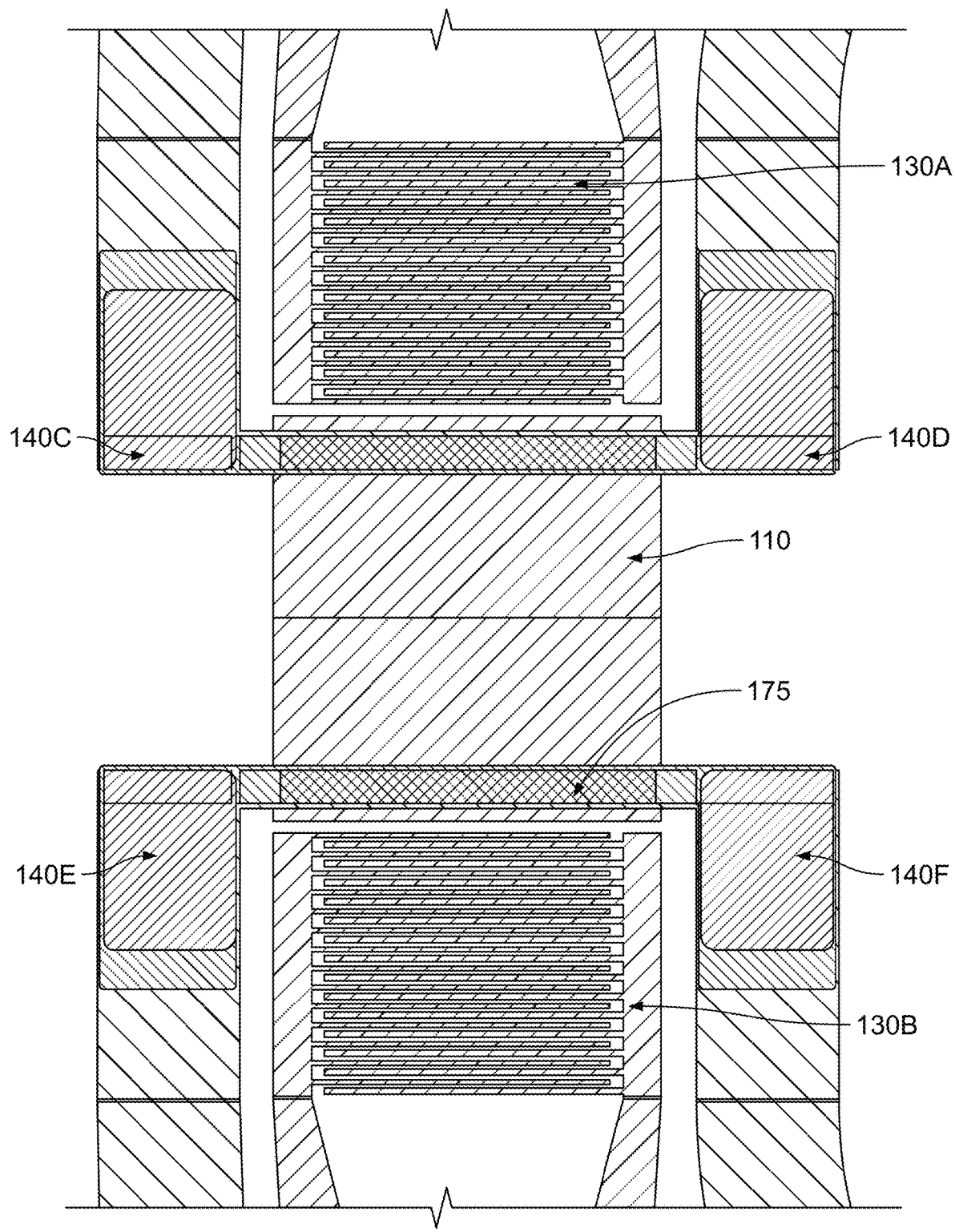

As the DC contacts 140A, 140B illustrated in FIGS. 1C and 1D span the $In_{0.53}Ga_{0.47}As$ amplifier layer 110, the DC contacts 140A, 140B may create acoustic reflections. To minimize, or eliminate, these potential acoustic reflections, FIG. 1E illustrates an embodiment with a different configuration for the DC contacts. Specifically, the embodiment illustrated in FIG. 1E includes four DC contacts 140C-140F, with one located at least partially on each corner of the $In_{0.53}Ga_{0.47}As$ amplifier layer 110. The underlying epitaxial stack 150 for the embodiment illustrated in FIG. 1E is the same as that employed for the acoustoelectric amplifier 100 illustrated in FIGS. 1A-1D, with the only change being a revised DC contact mask layer.

Despite high $k^2$, YX $LiNbO_3$ is rarely utilized due to bulk wave radiation leading to propagation losses for the short and open boundary conditions of approximately $\alpha_m=0.5$ dB/Λ and $\alpha_f=0.25$ dB/Λ, respectively. See, K. Yamanouchi and K. Shibayama, "Propagation and Amplification of Rayleigh Waves and Piezoelectric Leaky Surface-Waves in $LiNbO_3$," Journal of Applied Physics, vol. 43, no. 3, pp. 856-862 (1972), the contents of which are incorporated herein by reference. However, the increased need for a higher $k^2$ and the corresponding larger bandwidth has led to studies of 0-15° YX $LiNbO_3$ with the objective of reducing attenuation. See, K. Hashimoto et al., "Ultra-wideband surface acoustic wave devices using Cu-grating/rotated-YX-$LiNbO_3$-substrate structure," Japanese Journal of Applied Physics Part 1-Regular Papers Short Notes & Review Papers, vol. 43, no. 5b, pp. 3063-3066 (2004), the contents of which are incorporated herein by reference. As will be appreciated by those of ordinary skill in the art, one may trade-off a high $k^2$ value for a lower intrinsic propagation loss, while retaining similar wave velocities. To this end, alternative cuts of YX $LiNbO_3$ may be employed for the piezoelectric layer 120, for example, 640 YX $LiNbO_3$.

Figure 2A:
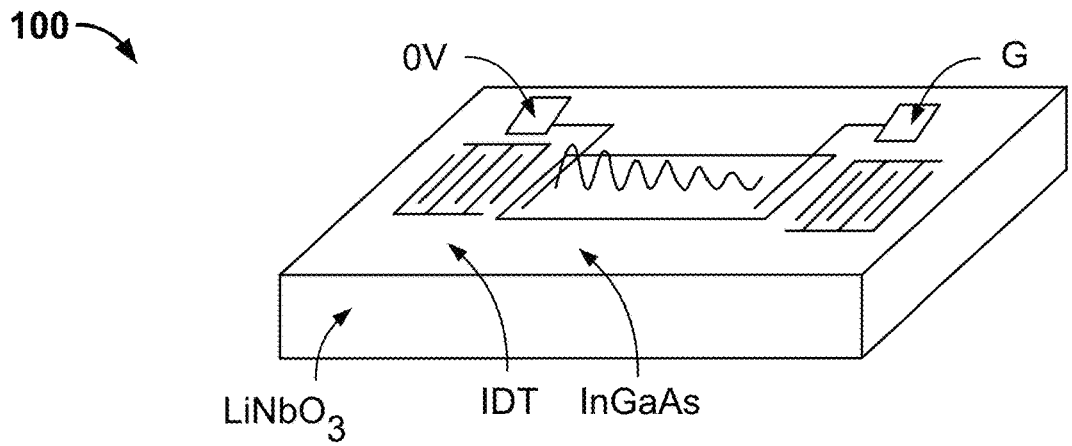
FIGS. 2A and 2B illustrate loss and gain, respectively, for an acoustoelectric amplifier in accordance with one or more embodiments.
Figure 2B:
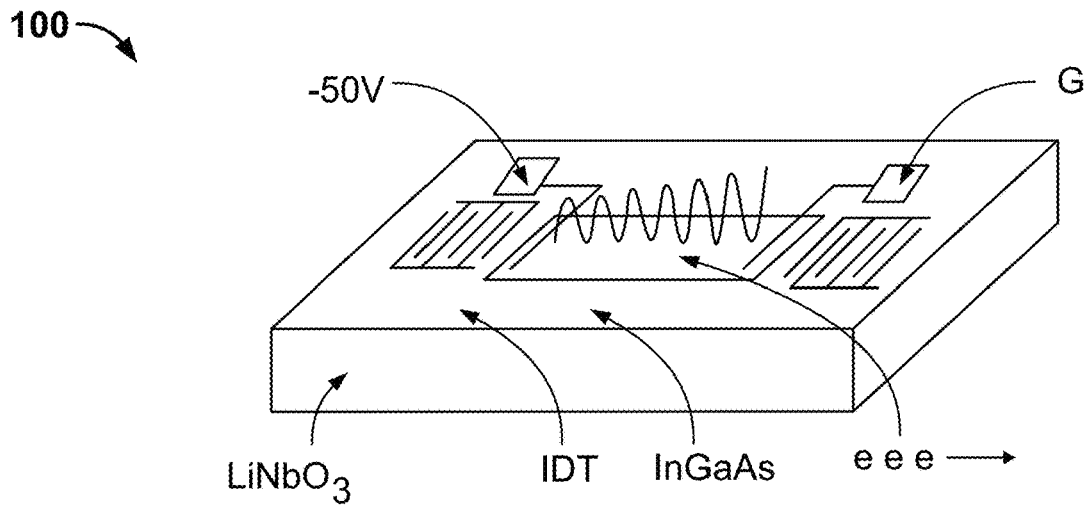

Large gains in the acoustoelectric amplifier 100 were measured due to the high $k_{AE}^2$ and optimized material platform of one or more embodiments. Whether the acoustoelectric amplifier 100 produces gain depends on the applied bias and the contribution of the intrinsic propagation loss to the AE effect. Without intrinsic propagation loss, there is gain when $v_d > v_s$ and loss when $v_d < v_s$ such that an applied synchronous drift voltage $v_{syn} = v_s l/\mu$ results in $\alpha/k_0 = 0$. As illustrated in FIG. 2A, when there is no drift voltage applied to the $In_{0.53}Ga_{0.47}As$ epitaxial film 110, the leaky surface acoustic wave (LSAW) is attenuated further than its intrinsic value due to the AE interaction. For LSAW amplification, as shown in FIG. 2B, the synchronous condition must be met, and the gain must be large enough to overcome the leaky propagation loss.

Figure 3:
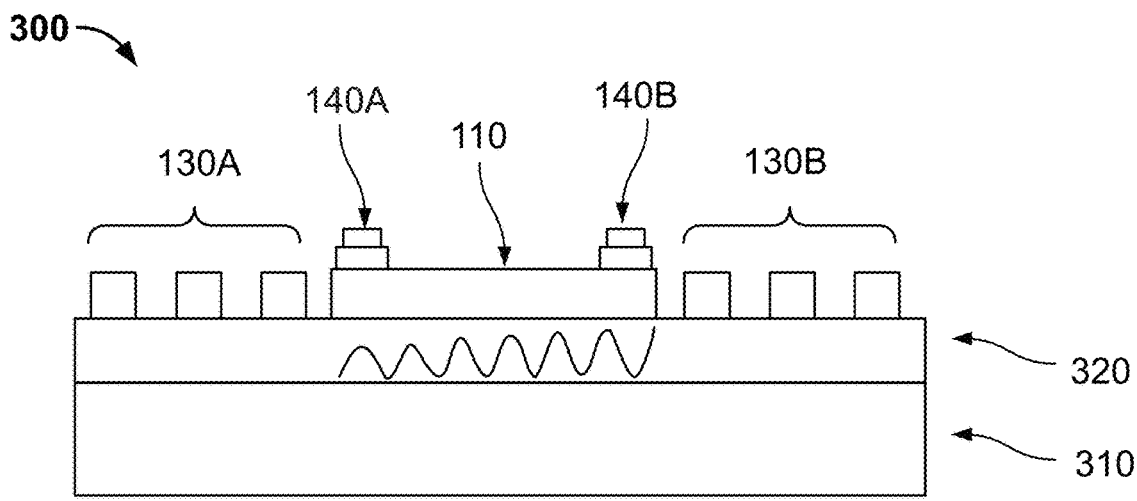
FIG. 3 illustrates an acoustoelectric amplifier in accordance with one or more embodiments.

While FIG. 1A illustrates a first cross-sectional configuration, FIG. 3 illustrates a second cross-section configuration in accordance with one or more other embodiments. In particular, the acoustoelectric amplifier 300 illustrated in FIG. 3 includes a hybrid substrate comprising a silicon (Si) substrate 310 with a piezoelectric layer 320 of $LiNbO_3$ thereon. Preferably a $LiNbO_3$ wafer is bonded directly to the Si substrate 310 without an interlayer followed by polishing the $LiNbO_3$ back to the desired thickness, resulting in the piezoelectric layer 320 of $LiNbO_3$. The Si substrate 310 preferably has a thickness of 300-600 μm, while the piezoelectric layer 320 of $LiNbO_3$ preferably has a thickness that is less than the acoustic wavelength Λ. The remainder of the acoustoelectric amplifier 300 is the same as the acoustoelectric amplifier 100 illustrated in FIG. 1A. The acoustoelectric amplifier 300 illustrated in FIG. 3 has the benefit of being more thermally conductive than the acoustoelectric amplifier 100 illustrated in FIG. 1A in that the thermal conductivity of Si is 150 W/m K, while the thermal conductivity of $LiNbO_3$ is only 4.6 W/m K. Thus, the acoustoelectric amplifier 300 illustrated in FIG. 3 can conduct heat away from the active amplifier region more rapidly than can the acoustoelectric amplifier 100 illustrated in FIG. 1A as a vast majority of the substrate is formed of Si rather than $LiNbO_3$. A second benefit of the acoustoelectric amplifier 300 illustrated in FIG. 3 is that the guided acoustic wave can more readily be confined in the vertical direction in the piezoelectric layer 320, i.e., there is two-dimensional (2D) confinement of the guided acoustic wave. This prevents coupling to bulk modes and therefore eliminates the propagation losses associated with a LSAW, such as those found in the acoustoelectric amplifier 100 illustrated in FIG. 1A. Therefore, the shear horizontal mode on YX $LiNbO_3$ can be used, which provides the highest $k_{AE}^2$ for a SAW on a non-suspended structure.

Figure 4A:
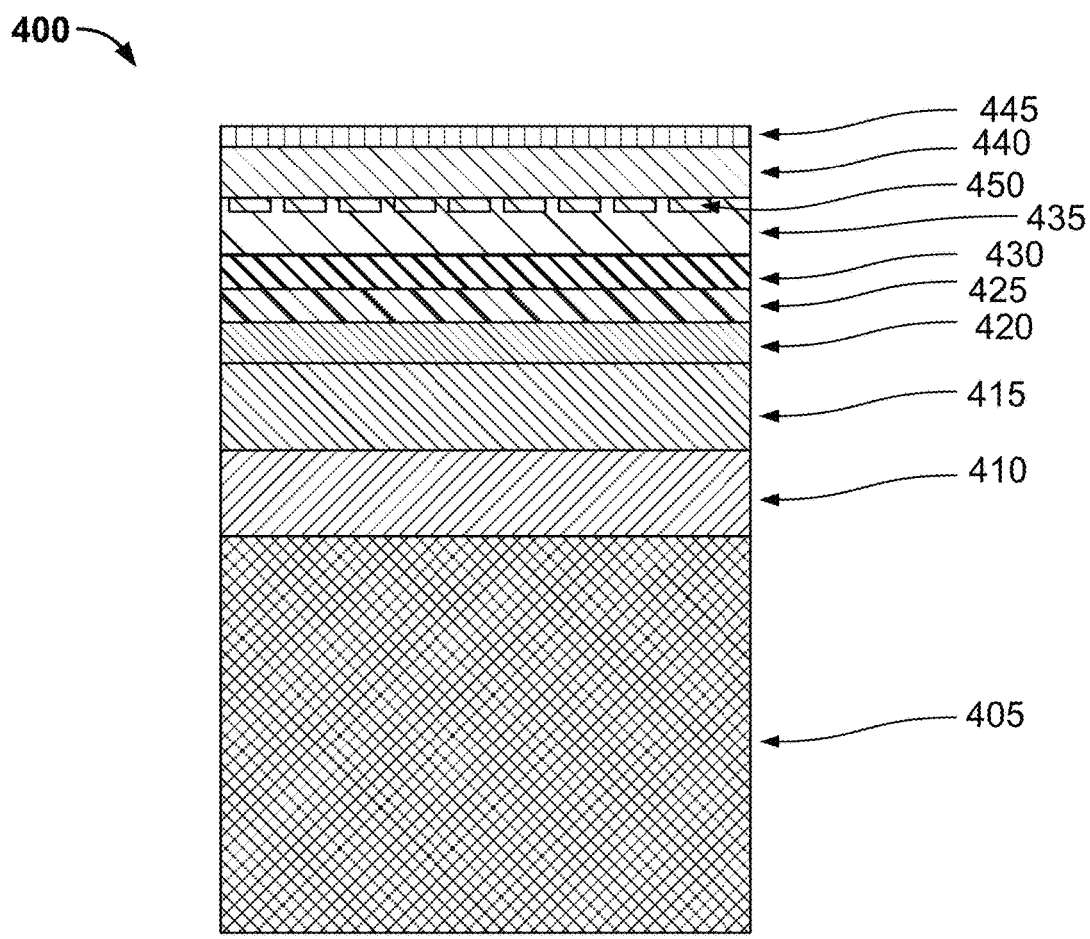
FIGS. 4A and 4B illustrate a two-dimensional electron gas (2DEG) structure and a corresponding acoustoelectric amplifier in accordance with one or more embodiments.
Figure 4B:
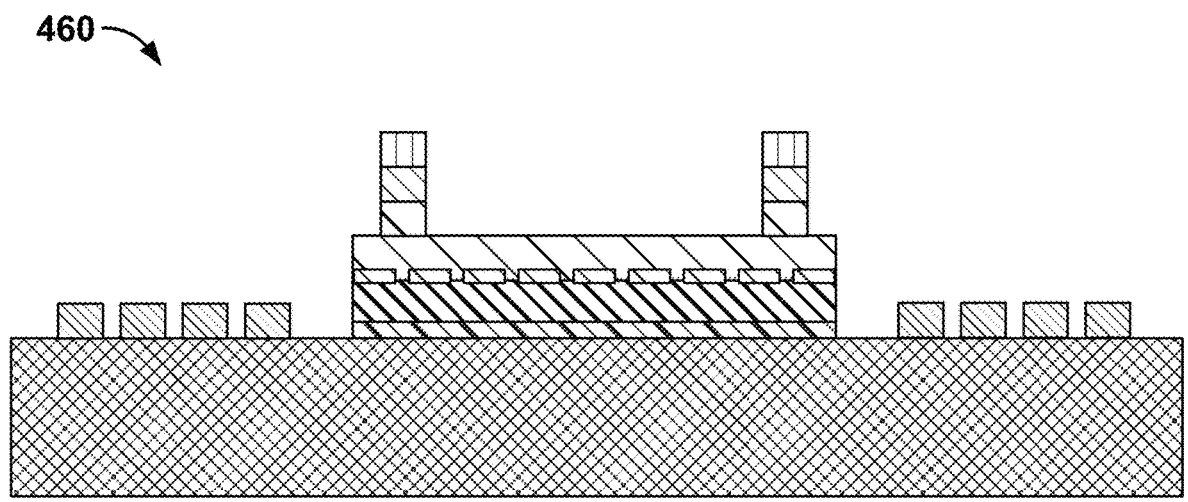

Other embodiments may be employed in low temperature applications. Acoustoelectric devices intended to operate at cryogenic temperatures may employ a two-dimensional electron gas (2DEG) structure 400 as illustrated in FIG. 4A. The 2DEG structure 400 includes an InP substrate 405, an InP buffer layer 410, an $In_{0.53}Ga_{0.47}As$ etch stop layer 415, an InP etch stop layer 420, an $In_{0.53}Ga_{0.47}As$ contact layer 425, an InP etch stop layer 430, a wider bandgap $In_{0.52}Al_{0.48}As$ layer 435, an $In_{0.53}Ga_{0.47}As$ amplifier layer 440, and an InP cap layer 445. The electrons in the n-type doped wider bandgap $In_{0.52}Al_{0.48}As$ layer 435 collect at the interface between the wider bandgap $In_{0.52}Al_{0.48}As$ layer 435 and the $In_{0.53}Ga_{0.47}As$ amplifier layer 440 to form the 2DEG 450. FIG. 4B illustrates a cross-sectional view of an acoustoelectric amplifier 460 formed of the 2DEG structure 400.

The InP buffer layer 410 is preferably NID and has a thickness of approximately 500 nm. The $In_{0.53}Ga_{0.47}As$ etch stop layer 415 is preferably NID and has a thickness of approximately 1500 nm. The InP etch stop layer 420 is preferably doped n-type at approximately $1\times10^{18}$ cm$^{-3}$ and has a thickness of approximately 100 nm. The $In_{0.53}Ga_{0.47}As$ contact layer 425 is preferably doped n-type at approximately $2\times10^{19}$ cm$^{-3}$ and has a thickness of approximately 100 nm. The InP etch stop layer 430 is preferably doped n-type at approximately $1\times10^{18}$ cm$^{-3}$ and has a thickness of approximately 300 nm. The wider bandgap $In_{0.52}Al_{0.48}As$ layer 435 is preferably doped n-type between approximately $1\times10^{17}$ cm$^{-3}$ and $1\times10^{18}$ cm$^{-3}$ and has a thickness of approximately 50 nm or less. The $In_{0.53}Ga_{0.47}As$ amplifier layer 440 is preferably NID and has a thickness of approximately 50 nm. The InP cap layer 445 is preferably NID (thus highly insulating) and has a thickness of approximately 5 nm. The lattice-matched 2DEG structure 400 is preferably grown by MOCVD or MBE to ensure that it is substantially crystalline.

Fabrication of the LSAW Amplifier Device

Figure 5:
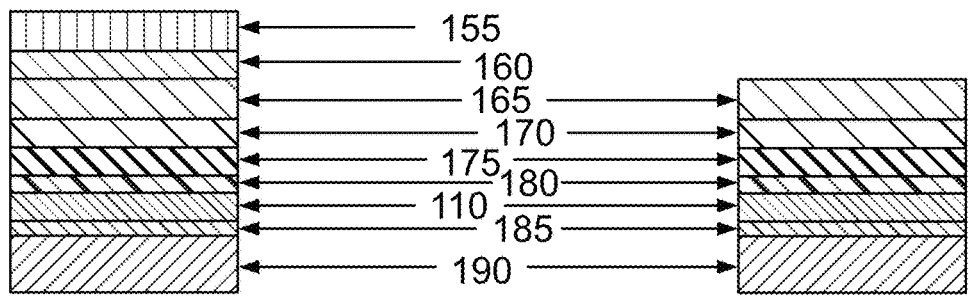
FIG. 5 illustrates the fabrication sequence for an acoustoelectric amplifier in accordance with one or more embodiments.
Figure 5:
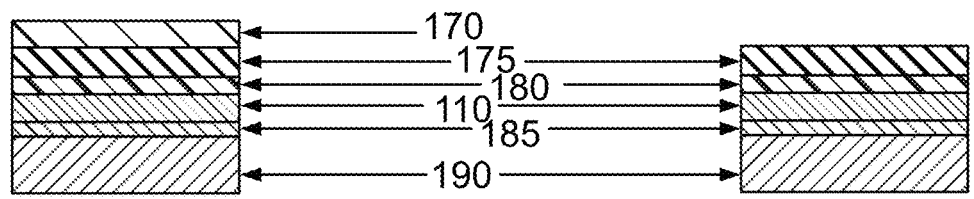
Figure 5:
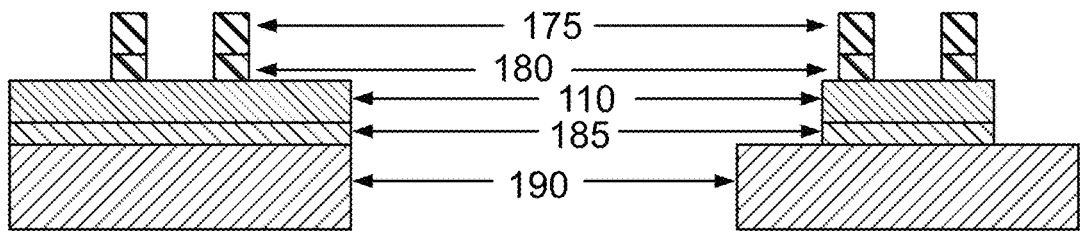
Figure 5:
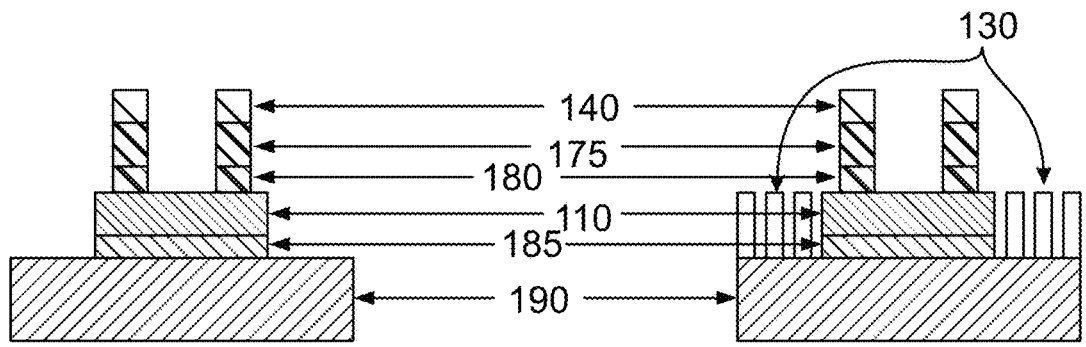

The fabrication process for the acoustoelectric amplifier 100, illustrated in FIG. 5, requires heterogeneous integration of the YX $LiNbO_3$ piezoelectric layer 120 and the lattice-matched $In_{0.53}Ga_{0.47}As(P)/InP$ epitaxial stack 150. The YX $LiNbO_3$ piezoelectric layer 120 is preferably formed of a 41° YX-cut black $LiNbO_3$ wafer 190 having, for example, a diameter of 4 inches. The InP cap layer 185 enables wafer-scale bonding of the lattice-matched $In_{0.53}Ga_{0.47}As(P)/InP$ epitaxial stack 150 to the hydrophilic $LiNbO_3$ wafer 190.

The lattice-matched $In_{0.53}Ga_{0.47}As(P)/InP$ epitaxial stack 150 is wafer-scale bonded to the 41° YX-cut black $LiNbO_3$ wafer 190 with the InP cap layer 185 in direct contact with the 41° YX-cut black $LiNbO_3$ wafer 190 in step 500. The wafer-scale bonding may be manually initiated followed by annealing, preferably at 100° C. under vacuum for preferably at least 12 hours. The InP substrate 155 and the InP buffer layer 160 are removed by a HCl wet etch in step 510. In step 520, the $In_{0.53}Ga_{0.47}As$ etch stop layer 165 is removed in a piranha solution, while in step 530 the InP etch stop layer 170 is removed with a mixture of HCl and phosphoric acid. The $In_{0.53}Ga_{0.47}As$ contact layer 175 and the InP etch stop layer 180 are included to assist in making quasi-Ohmic electrical contact to the $In_{0.53}Ga_{0.47}As$ amplifier layer 110. The $In_{0.53}Ga_{0.47}As$ contact layer 175 and the InP etch stop layer 180 are patterned by photolithography and wet-etched in step 540, followed by patterning and wet etching of the $In_{0.53}Ga_{0.47}As$ amplifier layer 110 and InP cap layer 185 in step 550. To finalize the fabrication of the acoustoelectric amplifier 100, two metal lift-of processes are carried out. The DC contacts 140A, 140B are formed on the $In_{0.53}Ga_{0.47}As$ amplifier layer 110 with a gold (Au) and silver (Ag) metal stack with a titanium (Ti) adhesion layer patterned on the $In_{0.53}Ga_{0.47}As$ contact layer 175 and the InP etch stop layer 180 in step 560. A second metal liftoff procedure employing aluminum (Al) with a chrome (Cr) adhesion layer defining the IDTs 130A, 130B on the 41° YX-cut black $LiNbO_3$ wafer 190 is performed in step 570. As will be appreciated by those of ordinary skill in the art, one may interchange the order of steps 560 and 570.

While not shown in the fabrication process for the acoustoelectric amplifier 100 illustrated in FIG. 5, a surface passivation layer on the $In_{0.53}Ga_{0.47}As$ amplifier layer 110 may be included in other embodiments. This optional surface passivation layer is preferably a material such as silicon dioxide, silicon nitride, or aluminum oxide. The optional surface passivation layer is preferably thin compared to the acoustic wavelength Λ, but thick enough to provide a continuous coating and prevent exposure of the semiconductor surface to air, water vapor, and chemicals used during subsequent processing. In addition, the optional surface passivation layer should be insulating, or it may short out portions of the acoustoelectric amplifier 100. This optional surface passivation layer would increase the mobility of the $In_{0.53}Ga_{0.47}As$ amplifier layer 110, thereby improving performance of the acoustoelectric amplifier 100.

Figure 6:
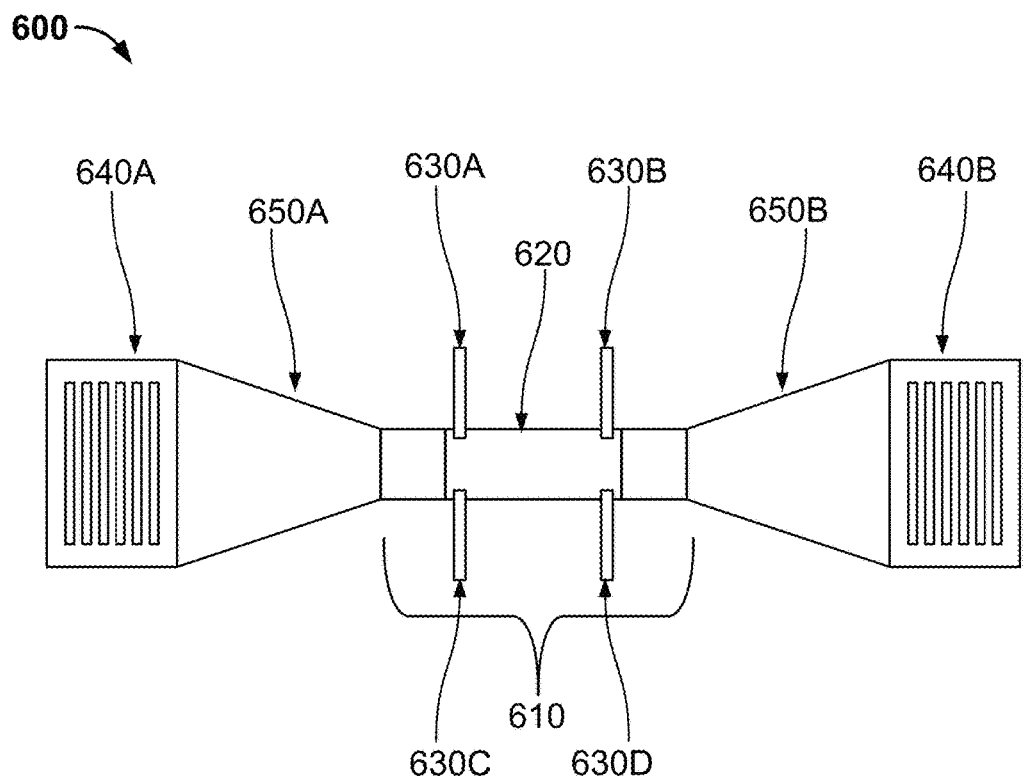
FIG. 6 illustrates an acoustoelectric amplifier in accordance with one or more embodiments.

In other embodiments, the fabrication process may form an acoustic waveguide 610, within an acoustoelectric amplifier device 600, as illustrated in FIG. 6. FIG. 6 illustrates that the $In_{0.53}Ga_{0.47}As$ amplifier layer 620 is etched away leaving only a small island of the $In_{0.53}Ga_{0.47}As$ amplifier layer 620 forming a portion of the acoustic waveguide 610, which has a width on the order of the acoustic wavelength Λ. DC contacts 630A-630D are adjacent to the edges of the $In_{0.53}Ga_{0.47}As$ amplifier layer 620, similar to the acoustoelectric amplifier 100 illustrated in FIG. 1E. Due to the size of the IDTs 640A, 640B, which is wide compared to the acoustic wavelength, for example, at least 15Λ to prevent diffraction losses, corresponding focusing elements, such as acoustic horns 650A, 650B are employed. The design of the acoustoelectric amplifier device 600 illustrated in FIG. 6 provides the benefit of three-dimensional (3D) confinement of the guided acoustic wave when employing a $LiNbO_3$ piezoelectric layer on a Si substrate. The reduced width of the $In_{0.53}Ga_{0.47}As$ amplifier layer 620 also significantly improves thermal management in the acoustoelectric amplifier device 600 by increasing the resistance of the $In_{0.53}Ga_{0.47}As$ amplifier layer 620 and leading to improved lateral heat dissipation. In still other embodiments, the IDTs 640A, 640B and the acoustic horns 650A, 650B may be combined functionally by employing focusing IDTs with arc-shaped fingers rather than the linear fingers for the IDTs 640A, 640B illustrated in FIG. 6.

In alternative embodiments, the acoustic waveguide may be formed of a phononic crystal. In yet other alternative embodiments, the acoustic waveguide is formed of a suspended bridge of the piezoelectric layer acting as a waveguide.

Figure 7:
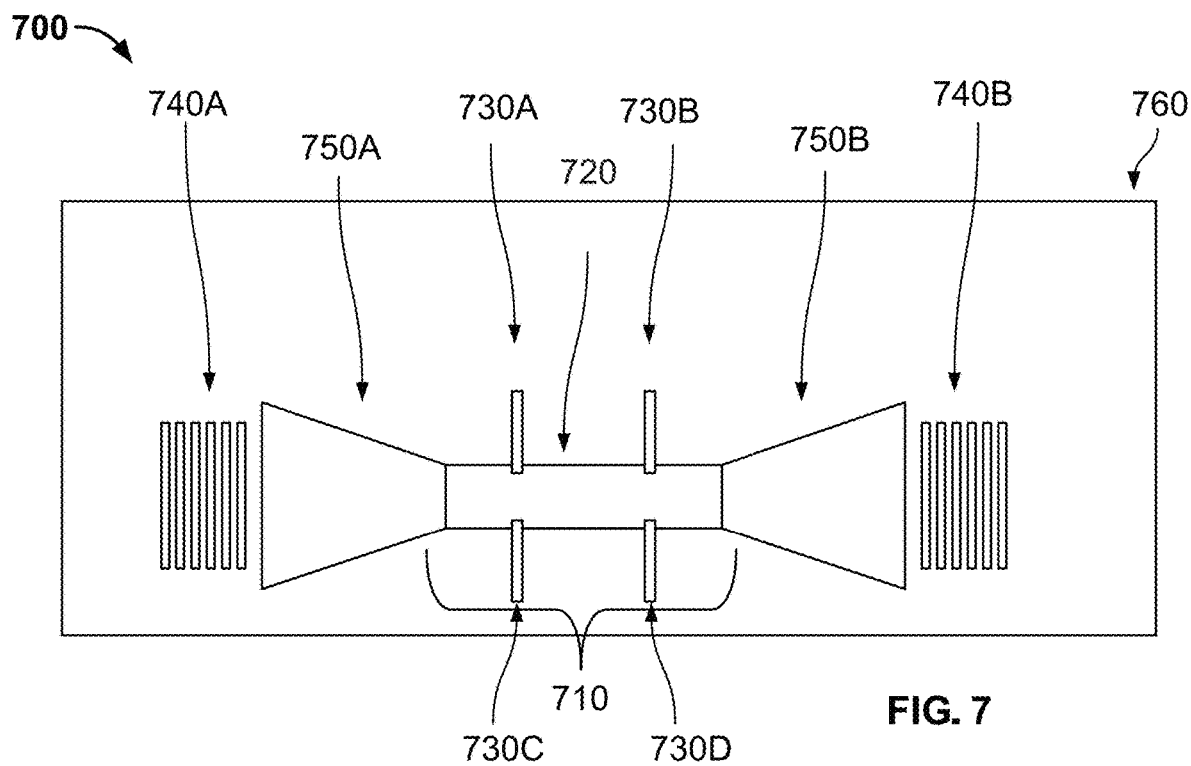
FIG. 7 illustrates an acoustoelectric amplifier in accordance with one or more embodiments.

In still other embodiments, the fabrication process may form an acoustic waveguide 710 having a barbell shape, within an acoustoelectric amplifier device 700, as illustrated in FIG. 7. FIG. 7 illustrates that the acoustic waveguide 710 is formed by etching away most of the $In_{0.53}Ga_{0.47}As$ amplifier layer. The $In_{0.53}Ga_{0.47}As$ amplifier 720 corresponds to the middle portion of acoustic waveguide 710, which has a width on the order of the acoustic wavelength Λ. DC contacts 730A-730D are adjacent to the edges of the $In_{0.53}Ga_{0.47}As$ amplifier 720, similar to the acoustoelectric amplifier 100 illustrated in FIG. 1E. Due to the size of the IDTs 740A, 740B, which is wide compared to the acoustic wavelength, for example, at least 15Λ to prevent diffraction losses, corresponding focusing elements, such as acoustic horns 750A, 750B are employed, being formed of the $In_{0.53}Ga_{0.47}As$ amplifier layer. The design of the acoustoelectric amplifier device 700 illustrated in FIG. 7 provides the benefit of three-dimensional (3D) confinement of the guided acoustic wave when employing a $LiNbO_3$ piezoelectric layer on a Si substrate 760. The reduced width of the In$_{0.53}$Ga$_{0.47}$As amplifier 720 also significantly improves thermal management in the acoustoelectric amplifier device 700 by increasing the resistance of the In$_{0.53}$Ga$_{0.47}$As amplifier layer 720 and leading to improved lateral heat dissipation.

Figure 8:
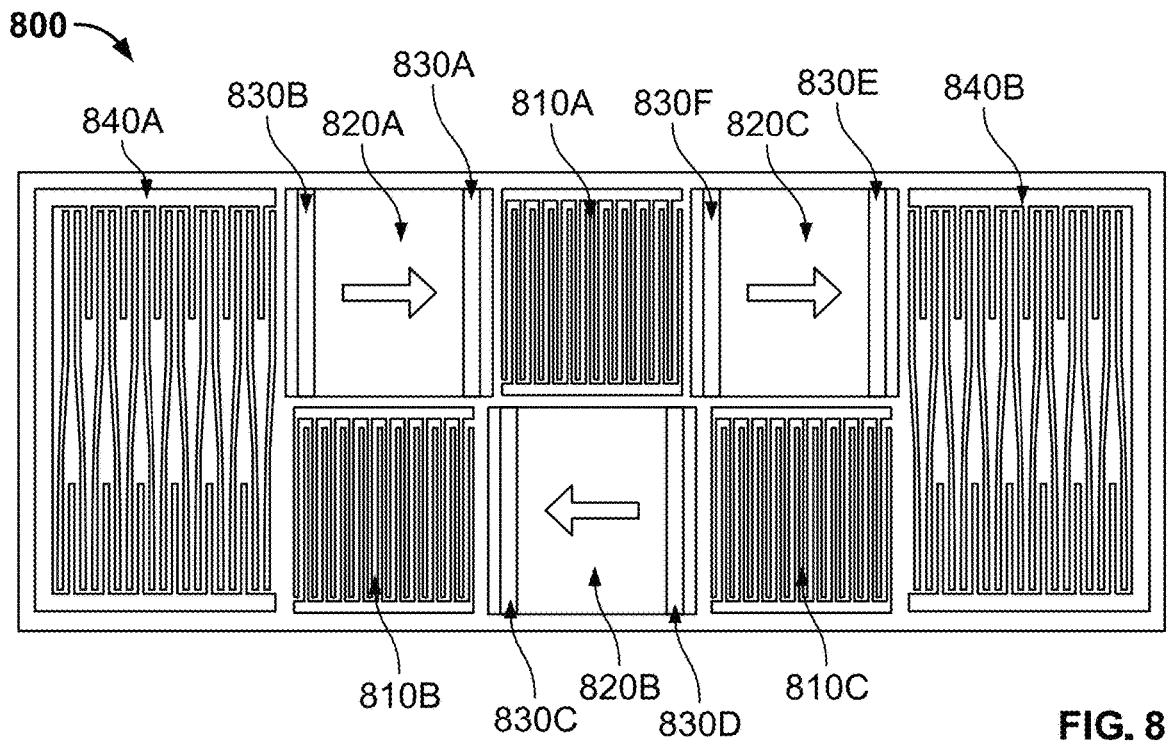
FIG. 8 illustrates a three-port circulator employing three acoustoelectric amplifiers in accordance with one or more embodiments.

In yet other embodiments, one may form a three-port circulator 800, as illustrated in FIG. 8. The three-port circulator 800 may be employed, for example, in wireless communications and radar requiring simultaneous transmit and receive (STAR). STAR-based systems can double the available RF bandwidth, but require isolation from the transmitter to the receiver channel, which both must be connected to the antenna with low insertion loss. The three-port circulator 800 provides nonreciprocal acoustic wave propagation because acoustic gain occurs when a SAW travels in the same direction as the unidirectional drift current, but the SAW is attenuated when it travels opposite to the drift current. Therefore, in the circulator three-port 800, an applied bias can tune the relative insertion loss and isolation of the two contra-propagating acoustic waves (clockwise and counter-clockwise).

The three-port circulator 800 includes three sets of IDTs 810A-810C, corresponding to Ports 1-3, with Port 1 associated with the transmitter, Port 2 associated with the antenna, and Port 3 associated with the receiver. In operation, the nonreciprocal acoustoelectric effect achieves large isolation from Port 1 to Port 3 with low insertion losses from Port 2 to Port 1 and from Port 3 to Port 2. The three-port circulator 800 further includes three In$_{0.53}$Ga$_{0.47}$As amplifier layer regions 820A-820C with corresponding DC contacts 830A-830F, and a pair of reversing multi-strip couplers (RMSCs) 840A, 840B for track changing. The black arrows over the three In$_{0.53}$Ga$_{0.47}$As amplifier layer regions 820A-820C indicate the drift field directions. In another embodiment, the circulator uses a phononic waveguide ring, rather than the two RMSCs of the embodiment illustrated in FIG. 8. In yet another embodiment, the circulator uses a patterned (etched) waveguide.

Figure 9:
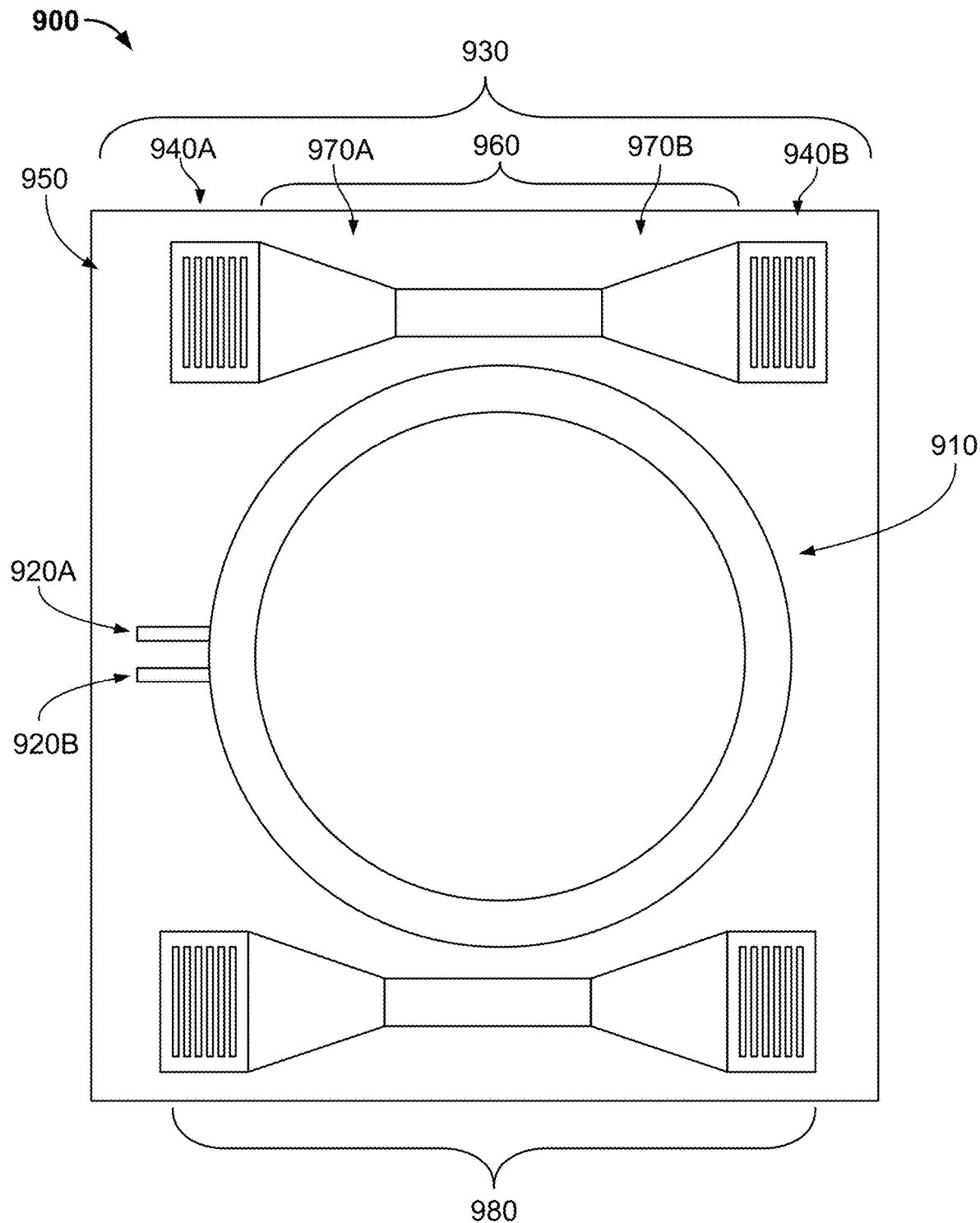
FIG. 9 illustrates a two-port circulator employing an acoustoelectric amplifier in accordance with one or more embodiments.

FIG. 9 illustrates a two-port circulator 900 in contrast to the three-port circulator 800 illustrated in FIG. 8, in accordance with at least one embodiment. The two-port circulator 900 includes a ring 910 of In$_{0.53}$Ga$_{0.47}$As amplifier material with a pair of DC contacts 920A, 920B coupled to the edge of the ring 910, similar to the configuration described above with reference to FIG. 1E. The width and radius of the ring 910 are selected to support a single resonant acoustic mode at the acoustic wavelength Λ. The two-port circulator 900 includes a first acoustic device 930 and a corresponding symmetric second acoustic device 980. The first acoustic device 930 includes first and second IDTs (or SPUDTs) 940A, 940B formed on a LiNbO$_3$ piezoelectric substrate 950 or a LiNbO$_3$ piezoelectric layer on a Si substrate. The first acoustic device 930 further includes a waveguide section 960 that includes acoustic horns 970A, 970B at either end. The waveguide section 940 is formed of In$_{0.53}$Ga$_{0.47}$As amplifier material and may be patterned at the same time as the ring 910. The spacing between the ring 910 and the waveguide section 960 should allow efficient coupling of a signal having an acoustic wavelength Λ from the waveguide section 960 to the ring 910. The elements of the second acoustic device 980 are identical to those found in the first acoustic device 930 and thus will not be described further.

Figure 10:
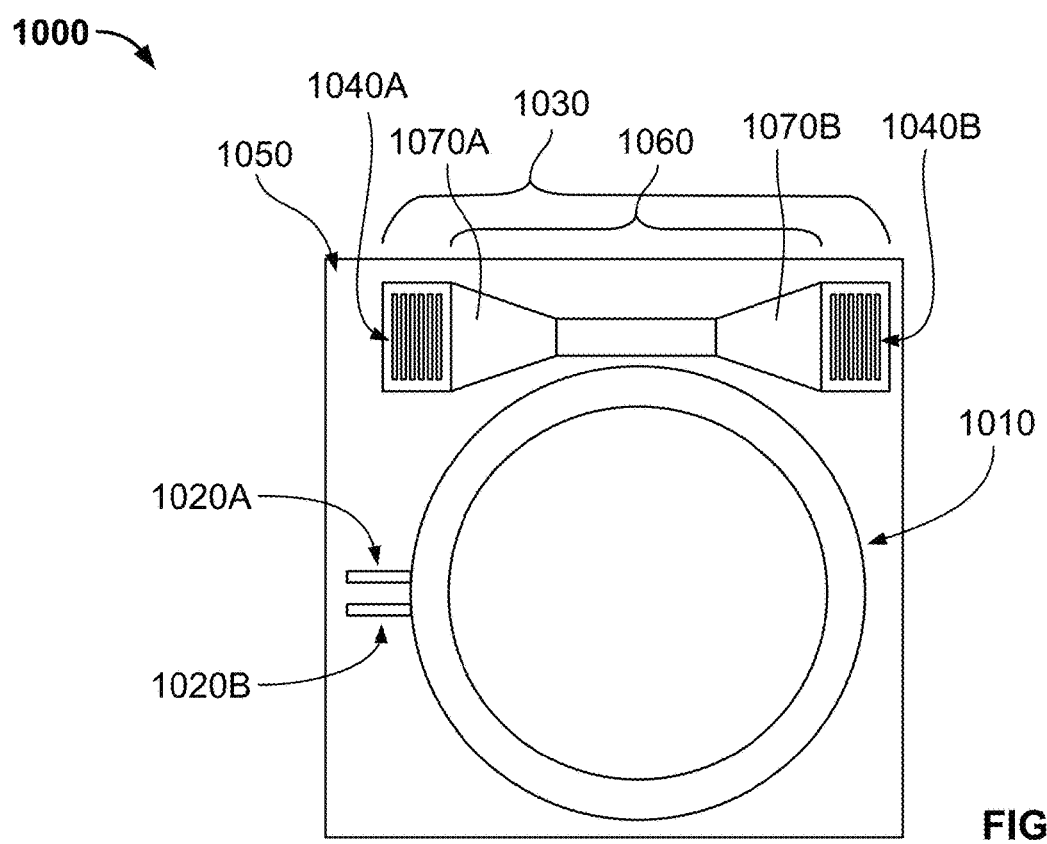
FIG. 10 illustrates a ring isolator employing an acoustoelectric amplifier in accordance with one or more embodiments.

FIG. 10 illustrates a ring isolator 1000 in accordance with at least one embodiment. The ring isolator 1000 includes a ring 1010 of In$_{0.53}$Ga$_{0.47}$As amplifier material with a pair of DC contacts 1020A, 1020B coupled to the edge of the ring 1010, similar to the configuration described above with reference to FIG. 1E. The width and radius of the ring 1010 are selected to support a single resonant acoustic mode at the acoustic wavelength Λ. The ring isolator 1000 includes an acoustic device 1030. The acoustic device 1030 includes first and second IDTs (or SPUDTs) 1040A, 1040B formed on a LiNbO$_3$ piezoelectric substrate 1050 or a LiNbO$_3$ piezoelectric layer on a Si substrate. The acoustic device 1030 further includes a waveguide section 1060 that includes acoustic horns 1070A, 1070B at either end. The waveguide section 1060 is formed of In$_{0.53}$Ga$_{0.47}$As amplifier material and may be patterned at the same time as the ring 1010. The spacing between the ring 1010 and the waveguide section 1060 should allow efficient coupling of a signal having an acoustic wavelength Λ from the waveguide section 1060 to the ring 1010.

Figure 11:
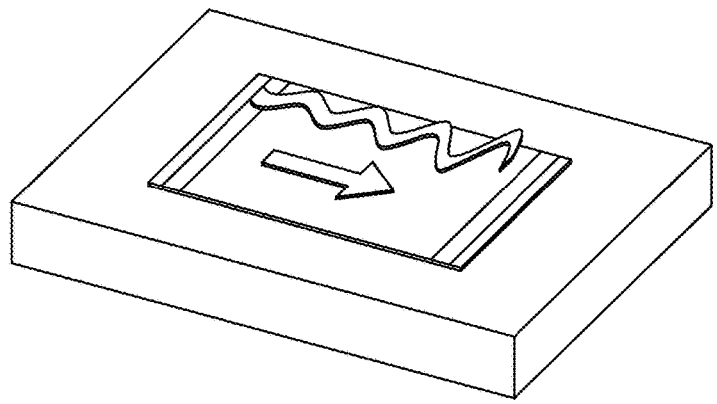
FIG. 11 illustrates a power amplifier in accordance with one or more embodiments.

FIG. 11 illustrates a power amplifier (PA) 1100. While the structure of the PA 1100 is similar to the acoustoelectric amplifier 100, the PA 1100 will require modifications for increased RF power handling. This can require both improved thermal dissipation through device design and the addition of an epitaxial layer with increased carrier concentration, N, to increase the RF saturation power. The carrier concentration N could also be varied for different acoustoelectric devices on the same wafer by the inclusion of gate electrodes that control the local carrier concentration with a bias field perpendicular to the acoustic wave propagation. This approach may be applied to both the epitaxial stack 150 illustrated in FIG. 1B and the 2DEG structure 400 illustrated in FIG. 4A.

Figure 12:
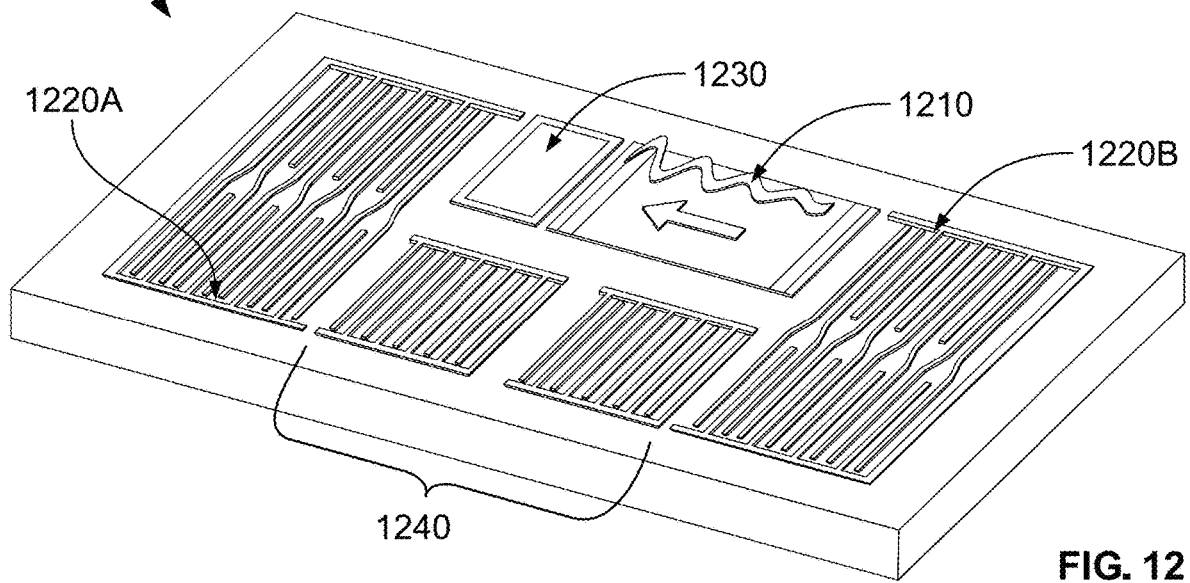
FIG. 12 illustrates a local oscillator in accordance with one or more embodiments.

FIG. 12 illustrates a local oscillator (LO) 1200, which could be implemented using an acoustic amplifier 1210 in a two-port ring filter optimized for low insertion loss, such that the round-trip gain exceeds the round-trip loss. The LO 1200 is then similar in function to the three-port circulator 800, but requires a modification of a path by a pair of RMSCs 1220A, 1220B. A set of gate electrodes 1230 may optionally be included to form a phase shifter as a part of the LO 1200. Lastly, the LO 1200 includes a filter 1240 to ensure operation at the desired frequency. Due to the acoustoelectric interaction, tuning the carrier concentration, N, via application of a gate voltage leads to a change in the SAW velocity, which results in a phase shift.

Figure 13:
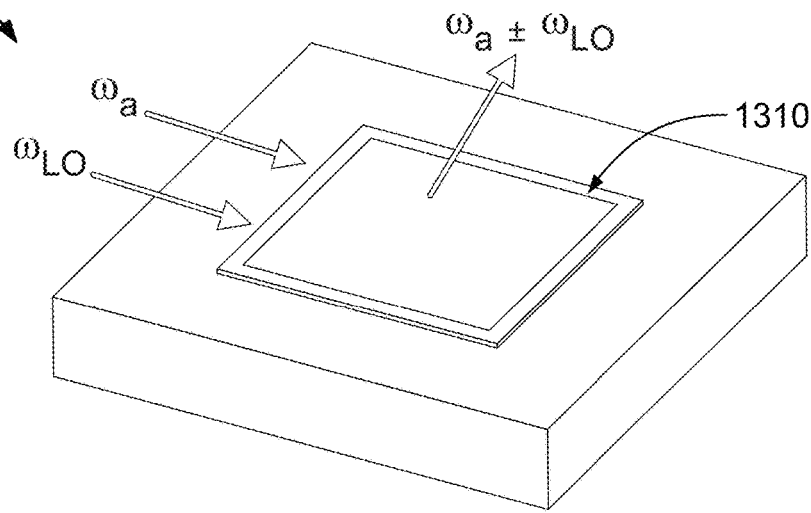
FIG. 13 illustrates a mixer in accordance with one or more embodiments.

FIG. 13 illustrates a mixer 1300 employing nonlinear frequency mixing. Two SAWs, one at the RF acoustic frequency $\omega_a$ and the other at the LO frequency $\omega_{LO}$, co-propagate along the surface of the acoustoelectric heterostructure. Frequency mixing between the two SAWs occurs through the nonlinear electron-phonon interaction. A readout electrode 1310 could then extract the desired signal at the upconverted or downconverted frequency.

Due to the use of a LiNbO$_3$ piezoelectric layer to form the above described acoustoelectric devices, various elements may be interconnected using waveguides formed of the LiNbO$_3$. In other embodiments, due to the use of an In$_{0.53}$Ga$_{0.47}$As amplifier layer to form the above described acoustoelectric devices, various elements may be interconnected using waveguides formed of the In$_{0.53}$Ga$_{0.47}$As.

Figure 14:
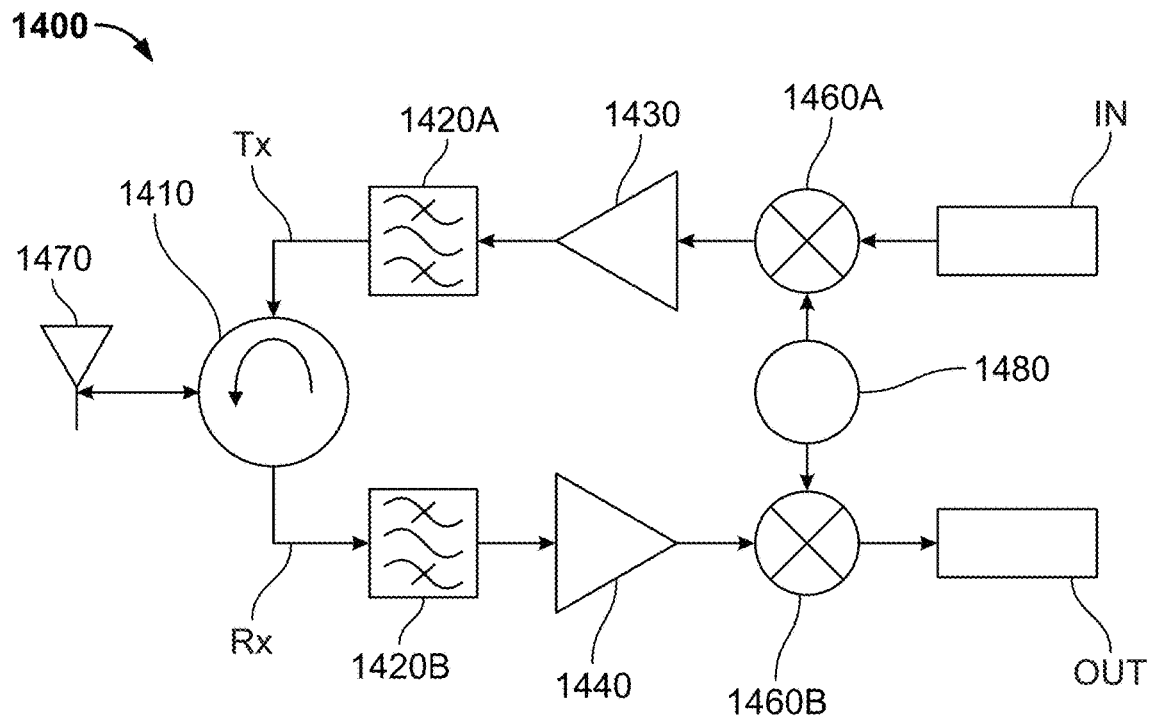
FIG. 14 illustrates a simultaneous transmit and receive radiofrequency signal processor mixer in accordance with the prior art.

FIG. 14 illustrates the fundamental components of a conventional STAR radiofrequency signal processor (RFSP) 1400 for a single frequency band as an example of the type of complex functions that can be implemented in accordance with the present invention. The RFSP 1400 includes a circulator 1410 implemented in a ferrite material. The RFSP 1400 implements passive filters 1420A, 1420B with piezoelectric acoustic wave technology. The RFSP 1400 also includes a PA 1430, a LNA 1440, a LO 1450, and a pair of mixers 1460A, 1460B, each of which is implemented with CMOS and compound semiconductor electronics. The RFSP 1400 is coupled to an antenna 1470 to transmit and receive RF signals. Many modern RF devices, such as Long-Term Evolution (LTE) smartphones, require separate RFSPs for more than 30 different frequency bands. As each band needs at least two filters, two mixers, one PA, one LNA, and one LO, this means that more than 60 filters and mixers are required in addition to more than 30 PAs, LNAs, and LOs.

Figure 15:
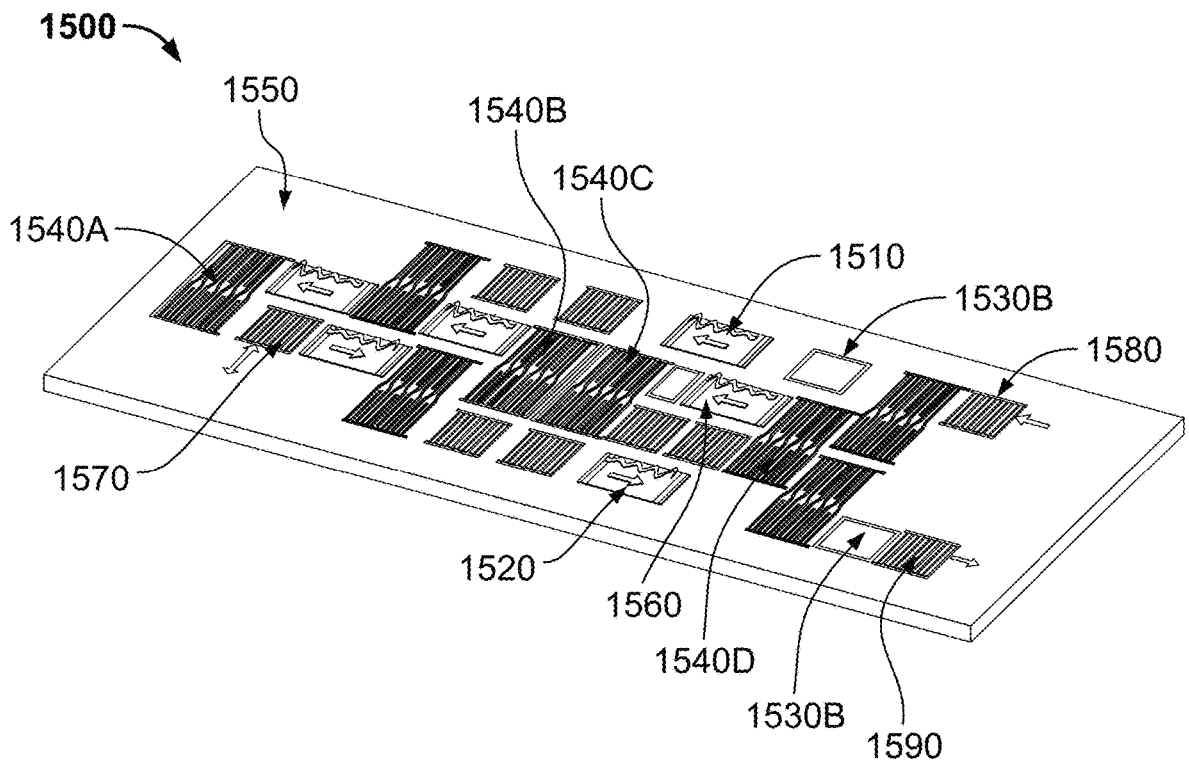
FIG. 15 illustrates a simultaneous transmit and receive radiofrequency signal processor mixer in accordance with one or more embodiments.

FIG. 15 illustrates an acoustic signal processor 1500 concept corresponding to the RFSP 1400, but implemented in the acoustic wave domain. Passive delay line and filtering components are achieved through interactions with periodic electrodes and RMSCs that serve as track changers. All active, nonlinear, and nonreciprocal functions are provided by the acoustoelectric interaction wherever $In_{0.53}Ga_{0.47}As$ amplifier layer material remains after processing. In particular, the PA 1510 and the LNA 1520 are achieved through the addition of acoustic amplification, while the mixers 1530A, 1530B are implemented using the enhanced nonlinearity from electron-phonon coupling. The combination of RMSC track changers 1540A-1540D for routing with the acoustoelectric effect enables an acoustic circulator 1550 and an LO 1560. The acoustic circulator 1550 is coupled to an antenna port 1570. The acoustic signal processor 1500 further includes a transmit input port 1580 and a receive output port 1590. Arrows on the various elements indicate the direction of acoustic wave propagation.

At 276 MHz, the approximate size of the acoustic signal processor 1500 chip in FIG. 15 would be 4.5 mm×1 mm. For the common LTE band occurring at approximately 1.9 GHz, the smaller acoustic wavelength reduces this size to approximately 0.65 mm×0.15 mm. In addition to a drastically reduced footprint and improved on-chip device integration, with an all-acoustic platform there is an increased opportunity to implement signal processing functions passively through design of the IDT transfer function, such as dispersion control and correlation. This could reduce the required functionality and power requirements of analog-to-digital converters and digital signal processors for applications that are constrained by cost, power, and size requirements. Therefore, this approach could also lead to better device performance and reduced power consumption in addition to the significantly reduced footprint and improved on-chip integration.

Potential additional applications of this material platform, i.e., a semiconductor amplifier layer on a $LiNbO_3$ layer, include acoustic switch networks and the amplification of phonons in combination with $LiNbO_3$ piezoelectric optomechanical devices. Devices of this kind could also be utilized in chip-scale systems for RFSPs that use Brillouin interactions in integrated photonics. Given that the gain in Brillouin amplifiers and lasers is inversely proportional to phonon loss rates, the ability to actively control these loss rates, and potentially reduce them to zero, could lead to unprecedented performance and novel functionality in these systems. Further, because the performance of these acoustoelectric devices are expected to improve at cryogenic temperatures when employing 2DEG structures, these devices may be able to play the role of circulators and low-noise, high-gain amplifiers for quantum phononic devices, potentially playing a role analogous to the Josephson parametric amplifier, which has been used for the readout of single microwave photons in superconducting circuit based quantum computing.

Characterization of Various Acoustoelectric Amplifier Devices

Acoustoelectric amplifier devices having three different device lengths (105 µm, 255 µm, and 505 µm) were characterized, though all devices were designed with an acoustic wavelength Λ of 16 µm and an aperture of 15Λ, resulting in a resonant frequency of 270 MHz. The 105 µm long device had a traditional IDT structure with an electrode pitch of Λ/2 for the IDTs 130A, 130B. The 205 µm and 505 µm long devices have single-phase unidirectional transducers (SPUDTs), as described below with reference to FIG. 16. The measured Hall mobility of the $In_{0.53}Ga_{0.47}As$ amplifier layer was 2000 $cm^2$/Vs.

Figure 16:
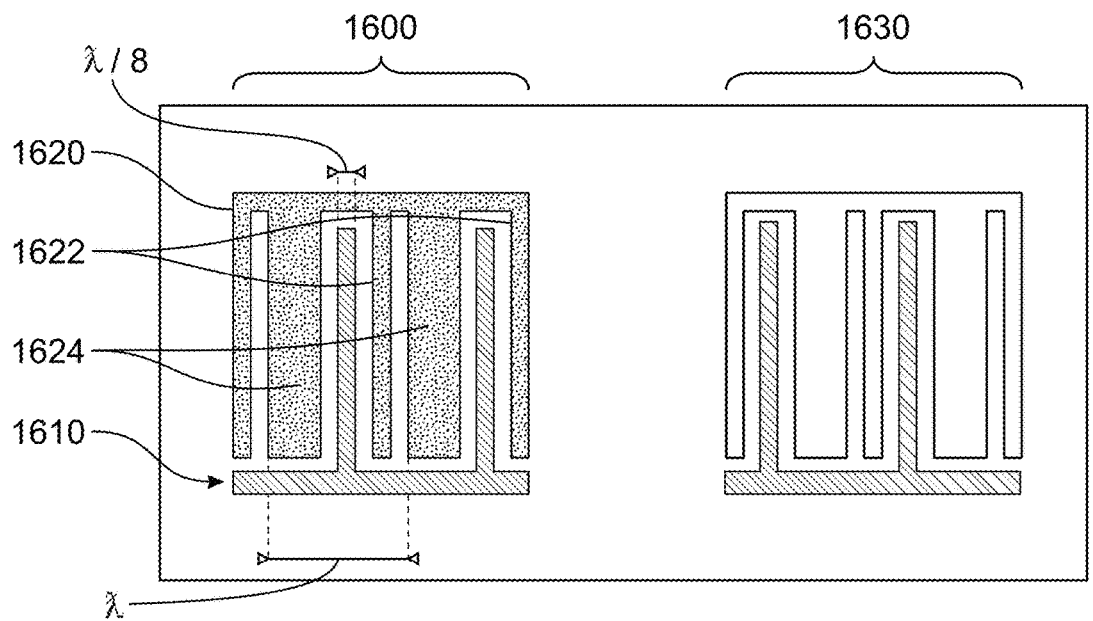
FIG. 16 illustrates a single-phase unidirectional transducer transmitter and a corresponding single-phase unidirectional transducer receiver as used in accordance with some embodiments.

FIG. 16 illustrates a SPUDT transmitter 1600 and a corresponding SPUDT receiver 1630 as used in accordance with some embodiments. The SPUDT transmitter 1600 includes a first transmit electrode 1610 having single narrow fingers 1612 with a repeating period of Λ, i.e., the acoustic wavelength, and a width of approximately Λ/8. The SPUDT transmitter also includes a second transmit electrode 1620 having both narrow fingers 1622 and wide fingers 1624, with widths of approximately Λ/8 and 3Λ/8, respectively. As with the first transmit electrode 1610, the narrow fingers 1622 and the wide fingers 1624 of the second transmit electrode have repeating periods of Λ. The SPUDT receiver 1630 is a mirror of the SPUDT transmitter 1600. The wide fingers 1624 function as acoustic reflectors. The distances between the narrow fingers 1612, 1622 and the wide fingers 1624 lead to constructive interference of the acoustic wave in the forward (right) direction and destructive interference of the acoustic wave in the backward (left) direction for the SPUDT transmitter 1600. Therefore, the 3 dB of signal lost per transducer for the traditional bidirectional IDT design is recovered for the SPUDT design.

Figure 17A:
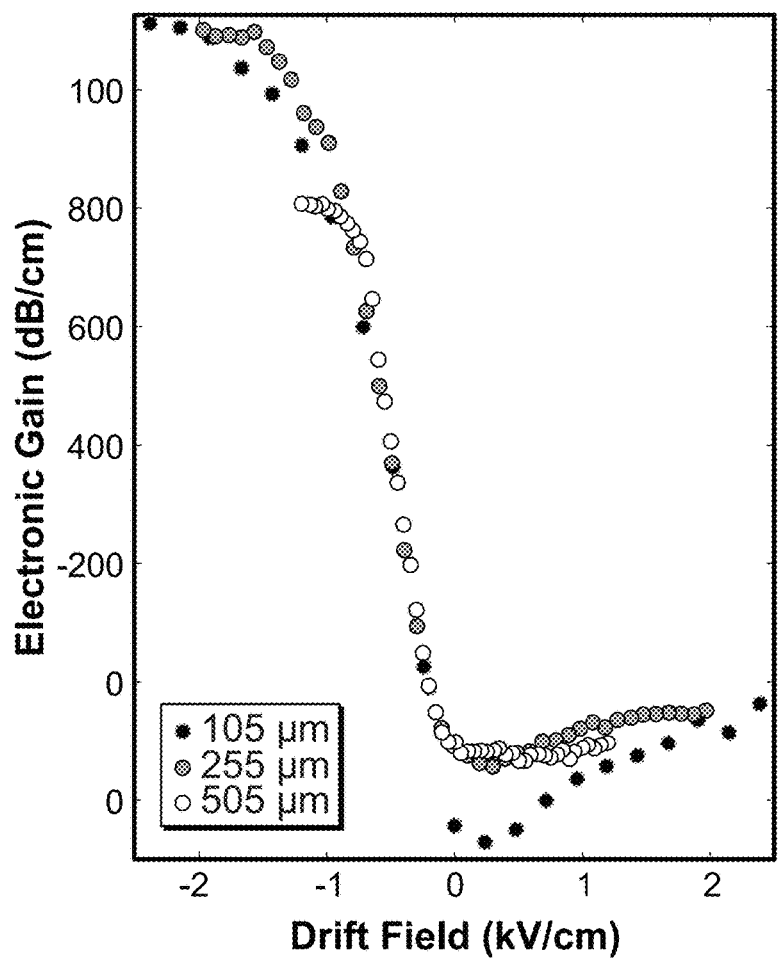
FIGS. 17A-17C illustrate the measured performance of acoustoelectric amplifiers in accordance with one or more embodiments.
Figure 17B:
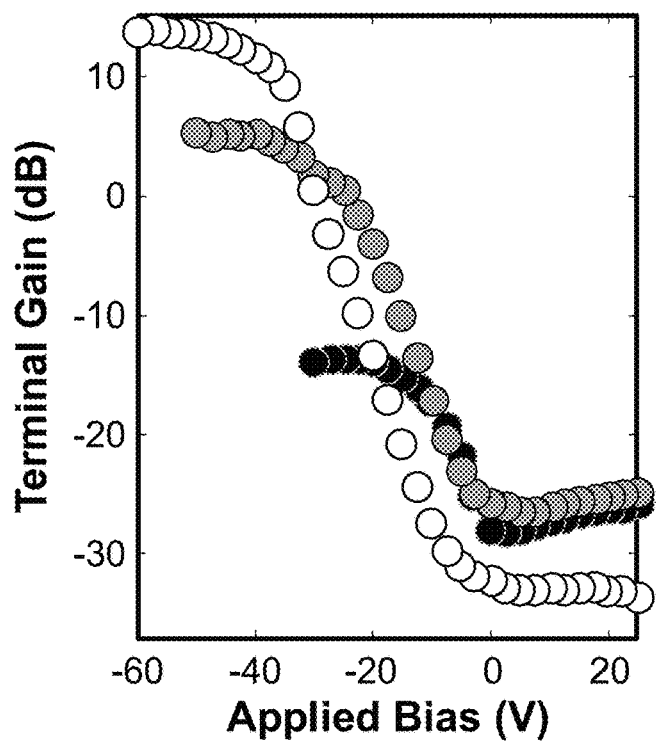

FIG. 17A illustrates the measured electronic gain plotted as a function of drift field for the 105 µm, 255 µm, and 505 µm long acoustoelectric amplifiers employing an $In_{0.53}Ga_{0.47}As$ amplifier layer having a Hall mobility of 2000 $cm^2$/Vs. FIG. 17B illustrates the terminal gain as a function of applied bias for the same three acoustoelectric amplifiers. As illustrated, an electronic gain of approximately 800 dB/cm was obtained at a drift field of 1.2 kV/cm for the 505 µm long acoustoelectric amplifier. This corresponds to an electronic gain of 1.3 dB/A and a terminal gain of 13.5 dB. The dissipated power for 13.5 dB of terminal gain was only 15 mW.

Figure 17C:
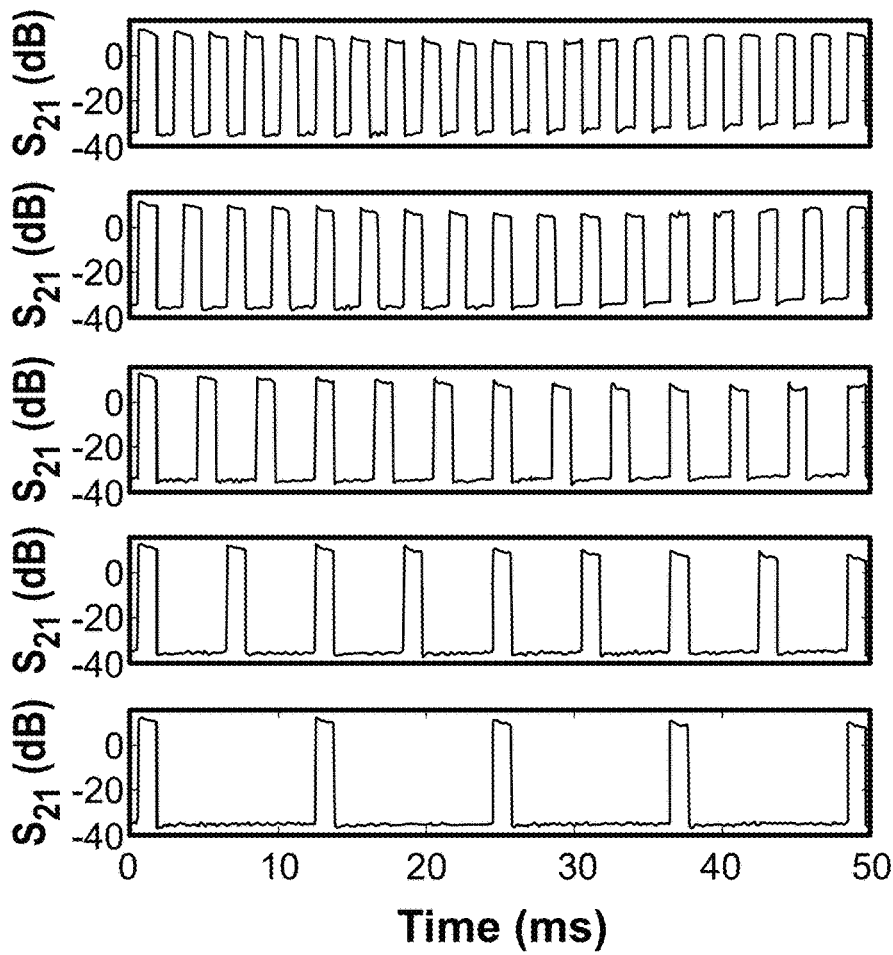

To avoid complications from thermal drift and run-away during characterization, which can corrupt gain measurements and even destroy the acoustoelectric amplifiers, the acoustoelectric amplifiers were operated in a pulsed mode with a duty cycle of 10% to 50%. A 1 ms voltage pulse was employed in conjunction with a 50 ms measurement cycle, as illustrated in FIG. 17C for the 505 µm long acoustoelectric amplifier. As illustrated in FIG. 17C, the gain pulses remain stable with over 10 dB of terminal gain.

Figure 18A:
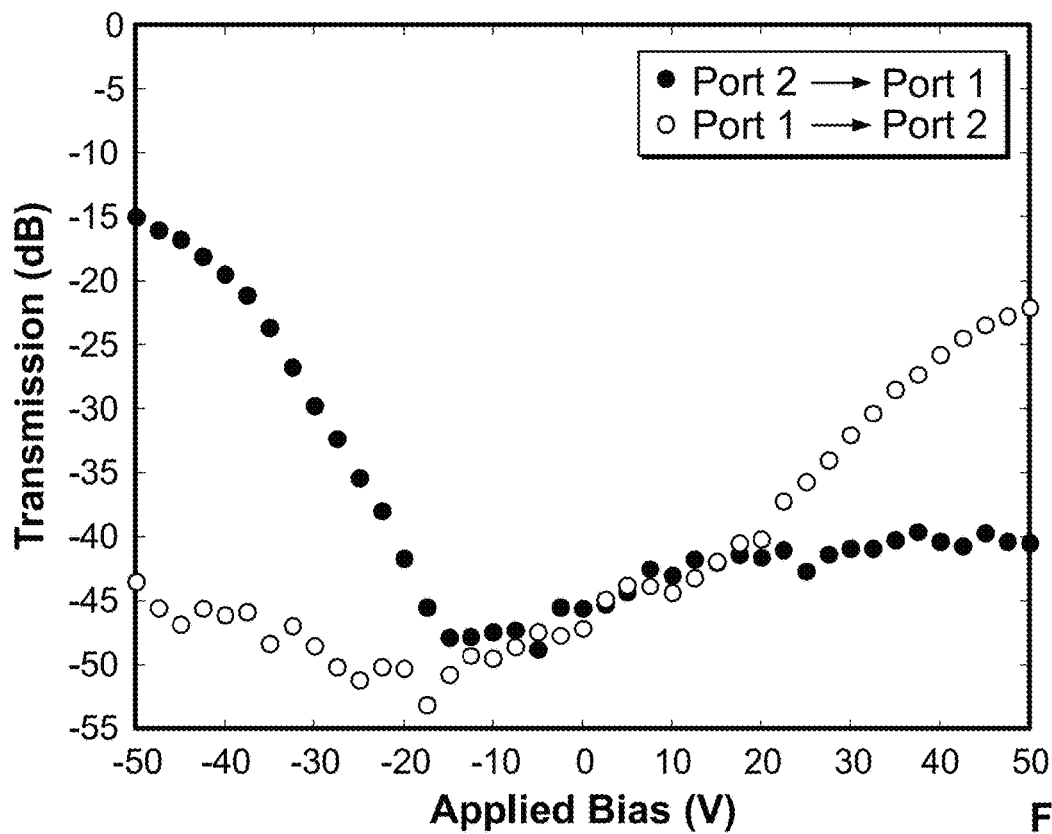
FIGS. 18A-18C illustrate the measured performance of a three-port circulator employing three acoustoelectric amplifiers in accordance with one or more embodiments.
Figure 18B:
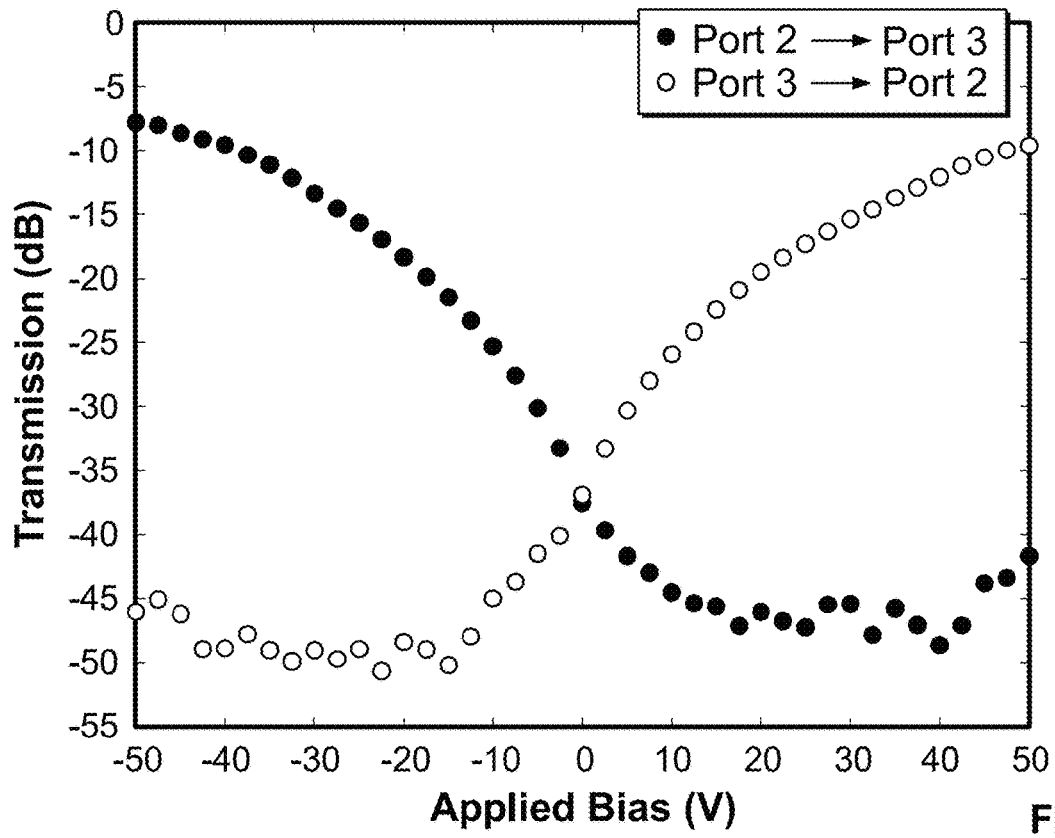
Figure 18C:
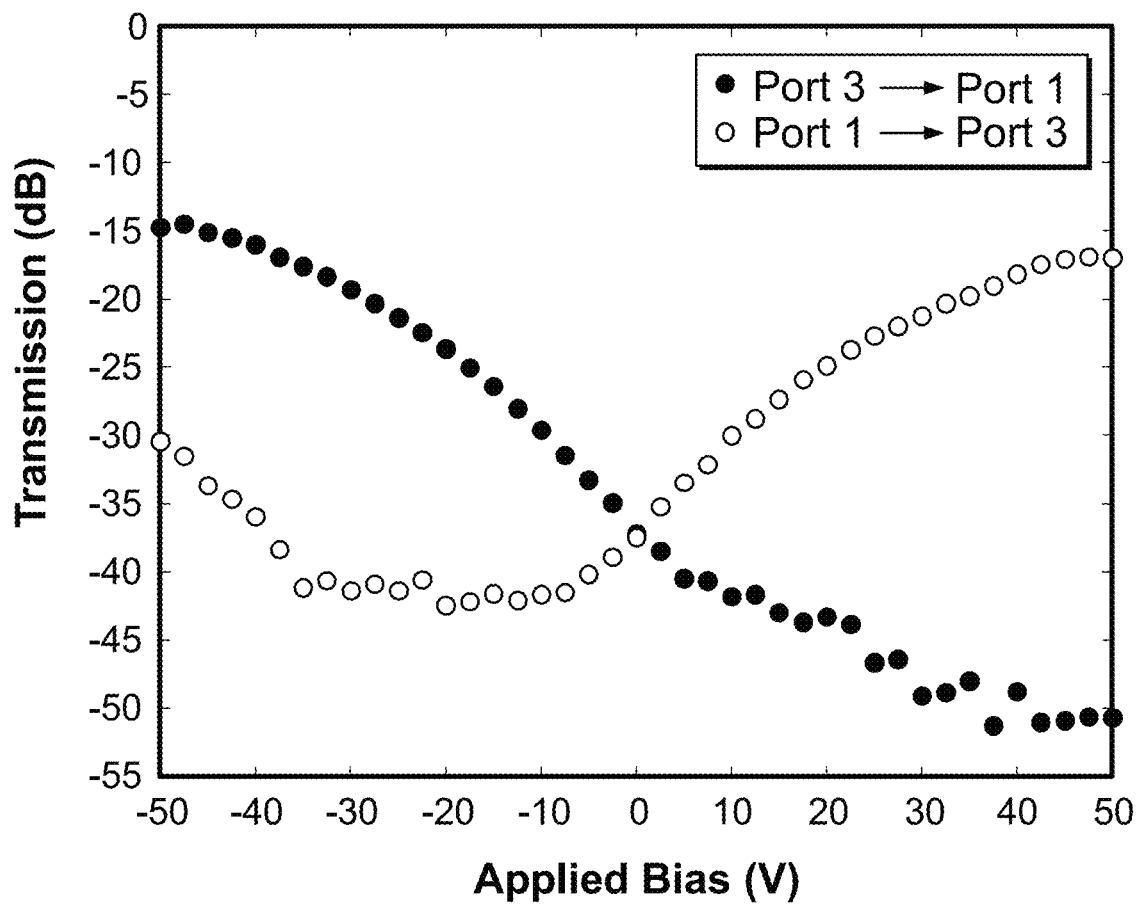

A three-port circulator, similar to that discussed above with reference to FIG. 8, was likewise characterized, as illustrated in FIGS. 18A-18C. FIGS. 18A-18C illustrate the transmission between Ports 1 and 2, Ports 2 and 3, and Ports 1 and 3, respectively. The insertion loss of the IDTs and RMSCs is relatively large in each case, with the insertion loss and the isolation between the Ports summarized in the following Table 1. Improved IDT design and chip layout would reduce the insertion losses.

TABLE 1

Circulator Insertion Loss and Isolation

| Ports | Insertion Loss (dB) | Isolation (dB) |
|---|---|---|
| 1 → 2 | 22 | 41 |
| 2 → 1 | 15 | 44 |
| 2 → 3 | 8 | 46 |
| 3 → 2 | 10 | 42 |
| 3 → 1 | 15 | 30 |
| 1 → 3 | 17 | 51 |

The invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. A device comprising an acoustoelectric amplifier, the acoustoelectric amplifier including:
   a piezoelectric layer;
   a substantially crystalline semiconductor amplifier layer, the semiconductor amplifier layer being acoustically thin, the semiconductor layer on the piezoelectric layer;
   first and second transducers, the first and second transducers on the piezoelectric layer; and
   first and second direct current (DC) contacts, the first and second DC contacts at least partially on the semiconductor amplifier layer.

2. The device of claim 1, wherein the piezoelectric layer includes one of LiNbO$_3$ or a hybrid substrate, the hybrid substrate including:
   a Si substrate; and
   a layer of LiNbO$_3$, the layer of LiNbO$_3$ on the Si substrate, a thickness of the layer of LiNbO$_3$ being substantially less than one acoustic wavelength (Λ) at an operating frequency in the layer of LiNbO$_3$.

3. The device of claim 1, wherein a thickness of the semiconductor amplifier layer is substantially less than one acoustic wavelength (Λ) at an operating frequency in the semiconductor amplifier layer.

4. The device of claim 3, wherein the thickness of the semiconductor amplifier layer is one of less than 0.5 Λ, less than 0.2 Λ, or less than 0.1 Λ.

5. The device of claim 1, further including an insulating surface passivation layer, the insulating surface passivation layer between the substantially crystalline semiconductor amplifier layer and the piezoelectric layer.

6. The device of claim 1, wherein the substantially crystalline semiconductor amplifier layer includes In$_{0.53}$Ga$_{0.47}$As.

7. The device of claim 1, wherein the substantially crystalline semiconductor amplifier layer includes an epitaxial stack, the epitaxial stack including:
   an InGaAs amplifier layer; and
   an InP cap layer, the InP cap layer between the InGaAs amplifier layer and the piezoelectric layer.

8. The device of claim 7,
   wherein the InGaAs amplifier layer has a composition of approximately In$_{0.53}$Ga$_{0.47}$As;
   wherein a doping level of the InGaAs amplifier layer is less than or equal to substantially 1×10$^{16}$ cm$^{-3}$;
   wherein a thickness of the InGaAs amplifier layer is less than or equal to substantially 100 nm;
   wherein the InP cap layer is not intentionally doped; and
   wherein a thickness of the InP cap layer is approximately 5 nm.

9. The device of claim 7, wherein the epitaxial stack further includes:
   an InP etch stop layer; and
   an InGaAs contact layer, the InP etch stop layer and the InGaAs contact layer between the InGaAs amplifier layer and the first and second DC contacts.

10. The device of claim 9,
    wherein a doping level of the InP etch stop layer is approximately 1×10$^{18}$ cm$^{-3}$;
    wherein a thickness of the InP etch stop layer is approximately 100 nm;
    wherein the InGaAs contact layer has a composition of approximately In$_{0.53}$Ga$_{0.47}$As;
    wherein a doping level of the InGaAs contact layer is approximately 2×10$^{19}$ cm$^{-3}$; and
    wherein a thickness of the InGaAs contact layer is approximately 100 nm.

11. The device of claim 7, wherein the epitaxial stack further includes:
    an InAlAs layer, the InAlAs layer between the InGaAs amplifier layer and the first and second DC contacts.

12. The device of claim 11,
    wherein the InAlAs layer has a composition of approximately In$_{0.52}$Al$_{0.48}$As;
    wherein a doping level of the InAlAs layer is between approximately 1×10$^{17}$ cm$^{-3}$ and 1×10$^{18}$ cm$^{-3}$; and
    wherein a thickness of the InAlAs layer is approximately 50 nm or less.

13. The device of claim 1,
    wherein the first and second transducers are integrated interdigital transducers (IDTs); and
    wherein the first and second transducers each includes an aperture equal to or greater than substantially 15 acoustic wavelengths (Λ) at an operating frequency in the semiconductor amplifier layer.

14. The device of claim 1,
    wherein the first and second transducers are single-phase unidirectional transducers (SPUDTs); and
    wherein the first and second transducers each includes a first plurality of fingers having a width of approximately one-eighth of an acoustic wavelength at an operating frequency in the semiconductor amplifier layer and a second plurality of fingers having a width of approximately three-eighths of the acoustic wavelength.

15. The device of claim 1, wherein a number of electrodes in each of the first and second transducers is adapted to impedance match the first and second transducers to substantially 50 ohms.

16. The device of claim 1, wherein the acoustoelectric amplifier includes an acoustic waveguide.

17. The device of claim 16, wherein the semiconductor amplifier layer forms a portion of the acoustic waveguide.

18. The device of claim 16, wherein the acoustic waveguide includes at least one of an acoustic horn, a phononic crystal, or a suspended bridge.

19. The device of claim 16, wherein the first and second transducers are focusing transducers.

20. The device of claim 1, wherein the device includes at least one of a three-port circulator, a two-port circulator, a ring isolator, a power amplifier, an oscillator, a mixer, or a correlator.

* * * * *